(12) United States Patent
Erturk et al.

(10) Patent No.: US 7,851,923 B2
(45) Date of Patent: Dec. 14, 2010

(54) LOW RESISTANCE AND INDUCTANCE BACKSIDE THROUGH VIAS AND METHODS OF FABRICATING SAME

(75) Inventors: Mete Erturk, St. Albans, VT (US); Robert A. Groves, Highland, NY (US); Jeffrey Bowman Johnson, Essex Junction, VT (US); Alvin Jose Joseph, Williston, VT (US); Qizhi Liu, Essex Junction, VT (US); Edmund Juris Sprogis, Underhill, VT (US); Anthony Kendall Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/410,728

(22) Filed: Mar. 25, 2009

(65) Prior Publication Data

US 2009/0184423 A1    Jul. 23, 2009

Related U.S. Application Data

(62) Division of application No. 11/275,542, filed on Jan. 13, 2006, now Pat. No. 7,563,714.

(51) Int. Cl.
*H01L 23/48* (2006.01)
(52) U.S. Cl. .............................. 257/773; 257/E23.011
(58) Field of Classification Search ................. 257/773, 257/774, 752, 754, 763, 915, E23.011
See application file for complete search history.

(56) References Cited

U.S. PATENT DOCUMENTS

| | | | |
|---|---|---|---|
| 4,982,266 A | 1/1991 | Chatterjee | |
| 5,897,370 A | 4/1999 | Joshi et al. | |
| 5,965,930 A | 10/1999 | Sakamoto et al. | |
| 6,028,348 A | 2/2000 | Hill | |
| 6,100,200 A | 8/2000 | Van Buskirk et al. | |
| 6,127,716 A | 10/2000 | Morizuka et al. | |
| 6,916,704 B2 | 7/2005 | Gutsche et al. | |
| 7,338,896 B2 | 3/2008 | Vanhaelemeersch et al. | |
| 7,563,714 B2 * | 7/2009 | Erturk et al. ................ | 438/675 |
| 2005/0164490 A1 | 7/2005 | Morrow et al. | |
| 2005/0253175 A1 | 11/2005 | Taddiken | |

OTHER PUBLICATIONS

Notice of Allowance (Mail Date Mar. 16, 2009) for U.S. Appl. No. 11/275,542, filed Jan. 13, 2006; Confirmation No. 1764.

* cited by examiner

*Primary Examiner*—Mark Prenty
(74) *Attorney, Agent, or Firm*—Schmeiser, Olsen & Watts; David Cain

(57) ABSTRACT

A backside contact structure and method of fabricating the structure. The method includes: forming a dielectric isolation in a substrate, the substrate having a frontside and an opposing backside; forming a first dielectric layer on the frontside of the substrate; forming a trench in the first dielectric layer, the trench aligned over and within a perimeter of the dielectric isolation and extending to the dielectric isolation; extending the trench formed in the first dielectric layer through the dielectric isolation and into the substrate to a depth less than a thickness of the substrate; filling the trench and co-planarizing a top surface of the trench with a top surface of the first dielectric layer to form an electrically conductive through via; and thinning the substrate from a backside of the substrate to expose the through via.

15 Claims, 17 Drawing Sheets

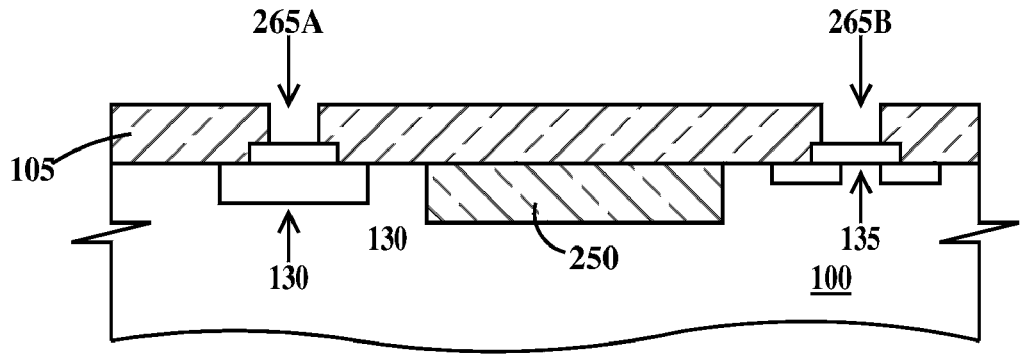
*FIG. 3A1*
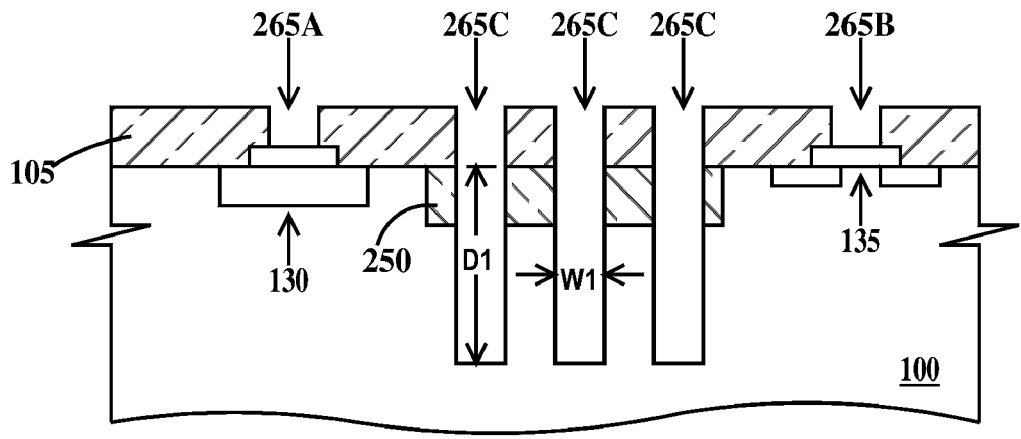
*FIG. 3A2*
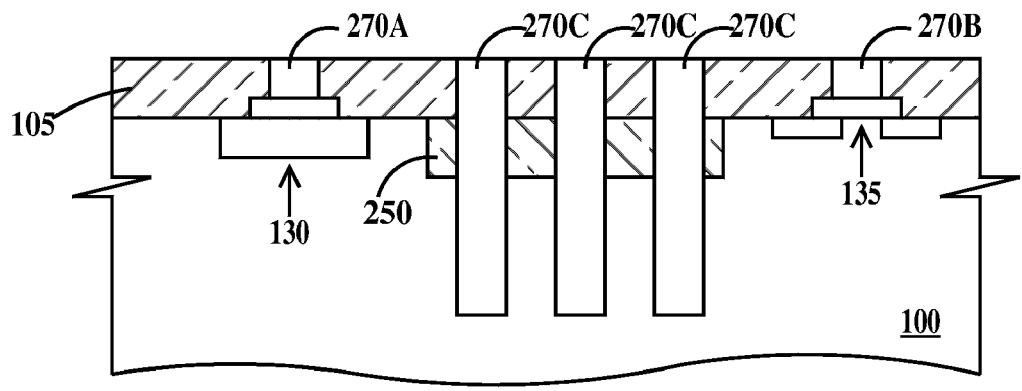
*FIG. 3A3*

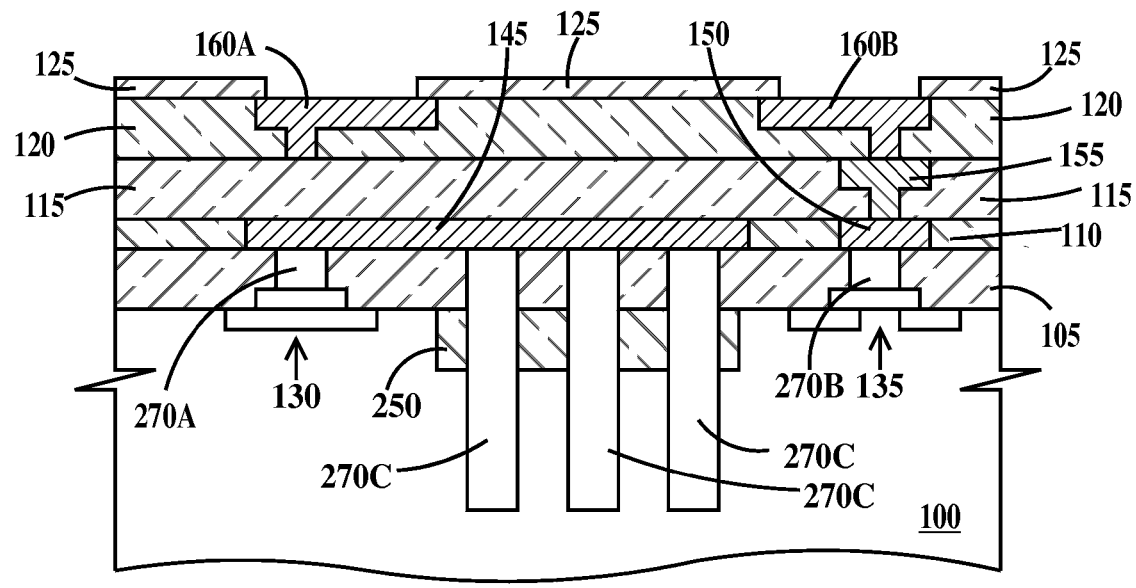
FIG. 3A4
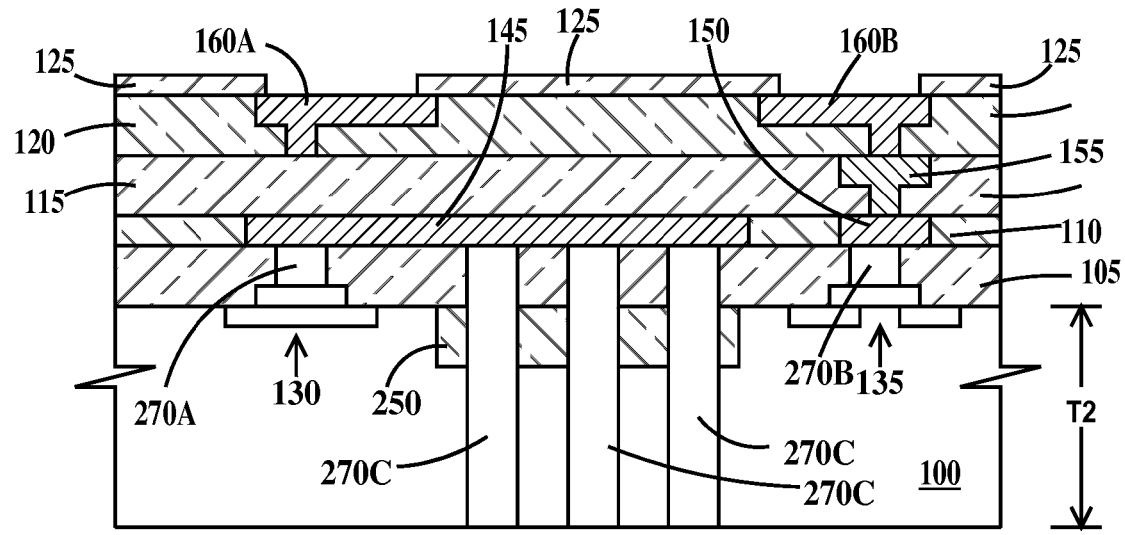
FIG. 3A5

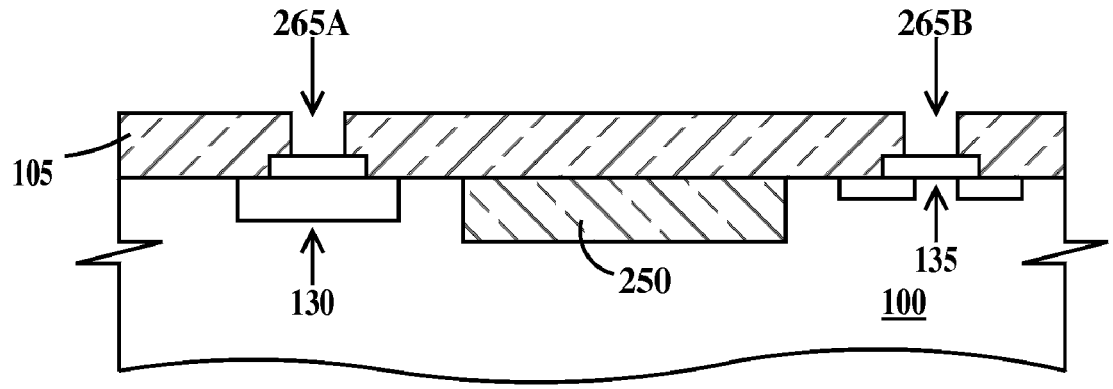
FIG. 3B1
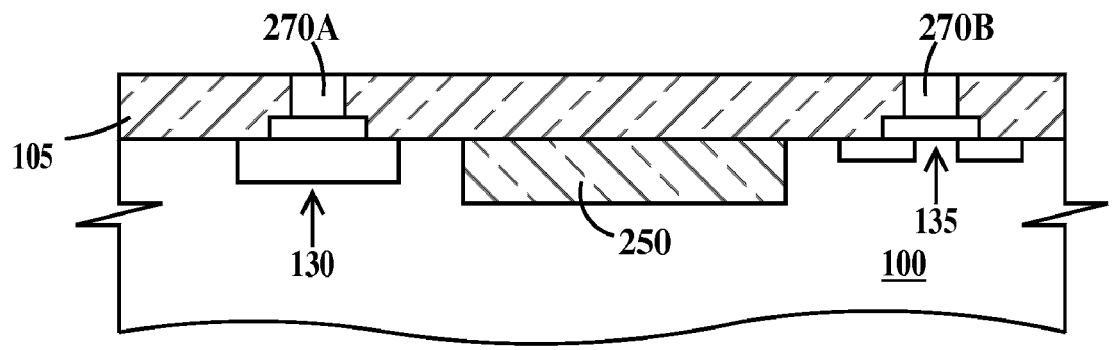
FIG. 3B2
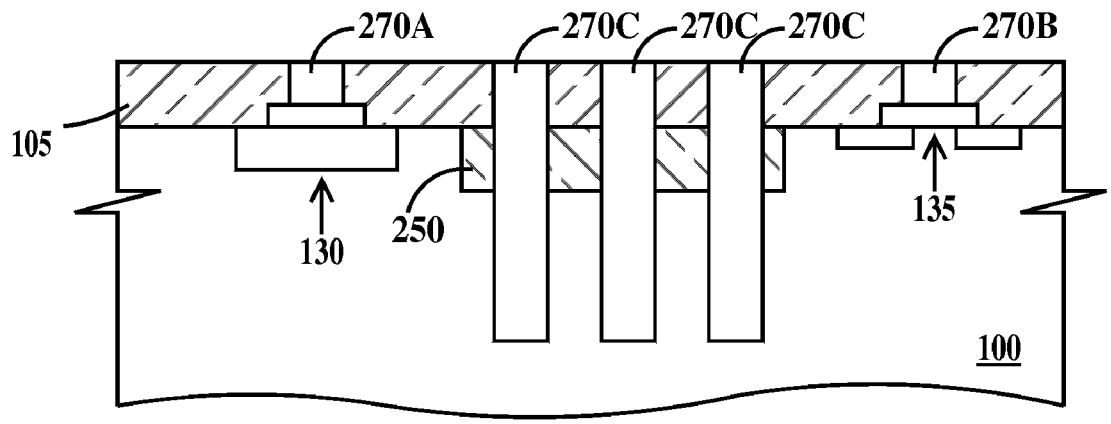
FIG. 3B3

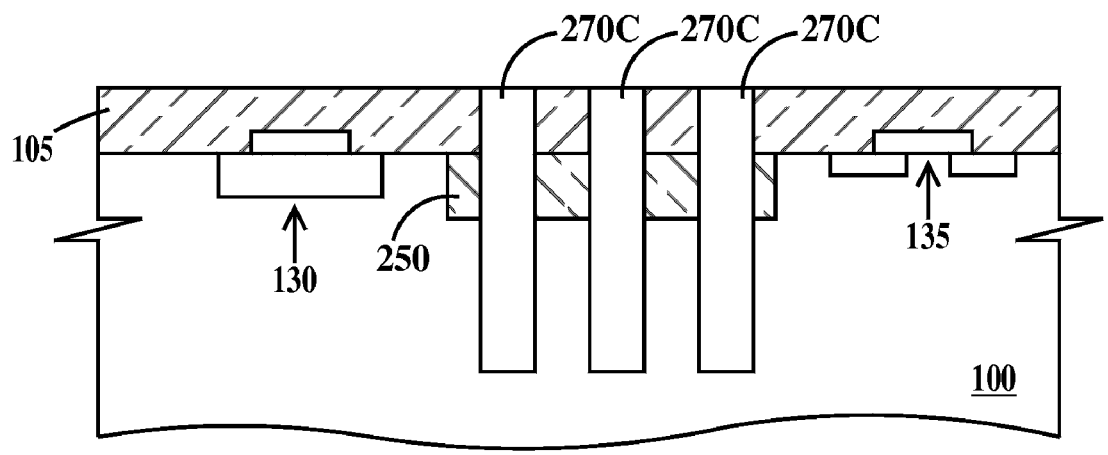
*FIG. 3C1*
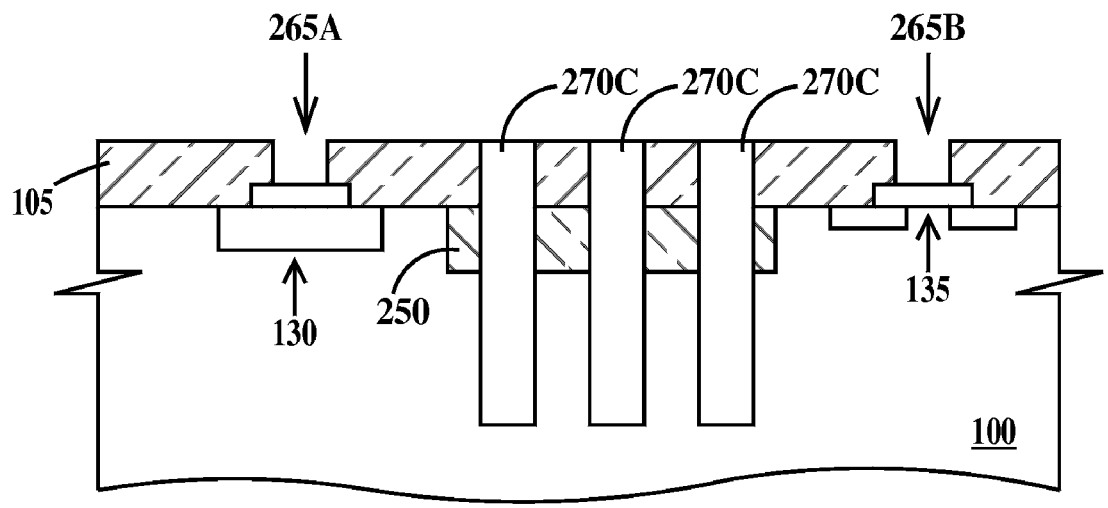
*FIG. 3C2*
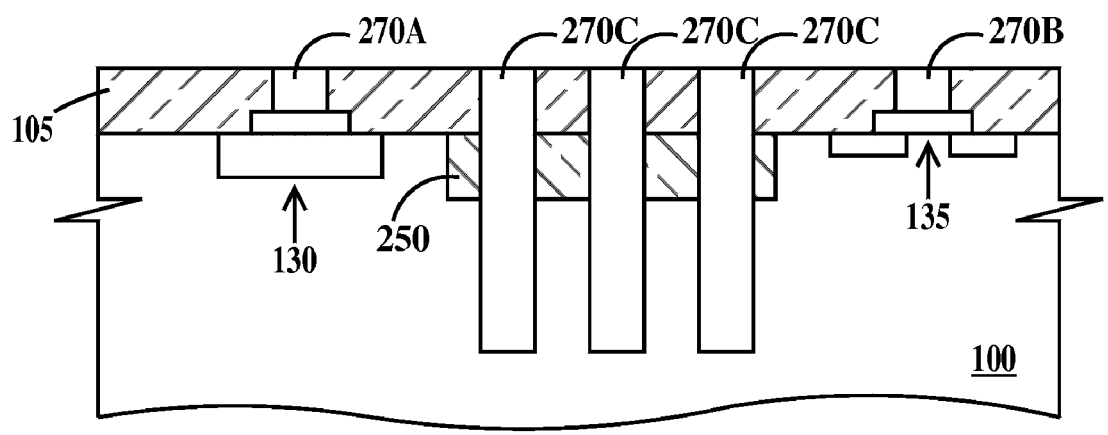
*FIG. 3C3*

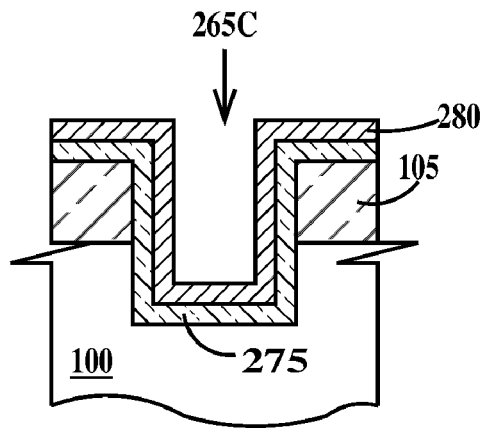
*FIG. 4A1*
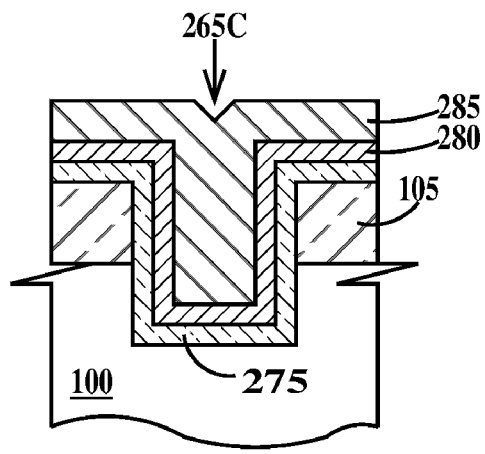
*FIG. 4A2*
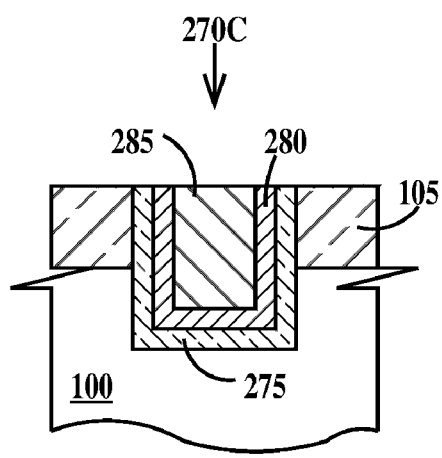
*FIG. 4A3*

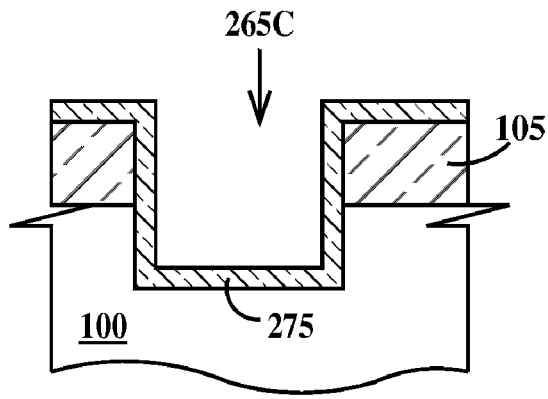
FIG. 4B1
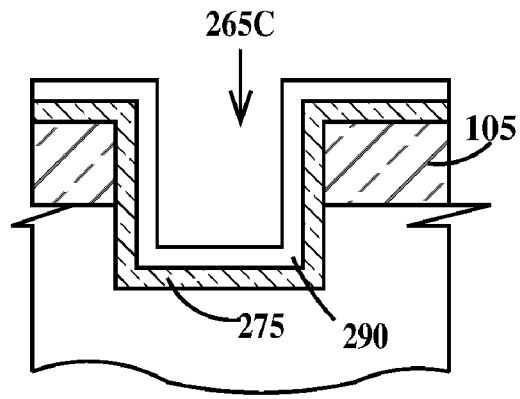
FIG. 4B2
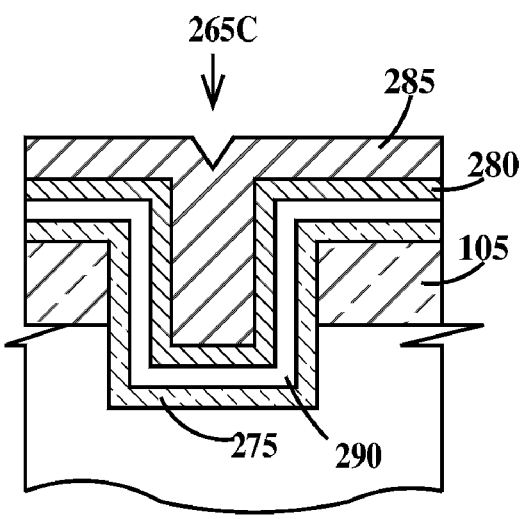
FIG. 4B3
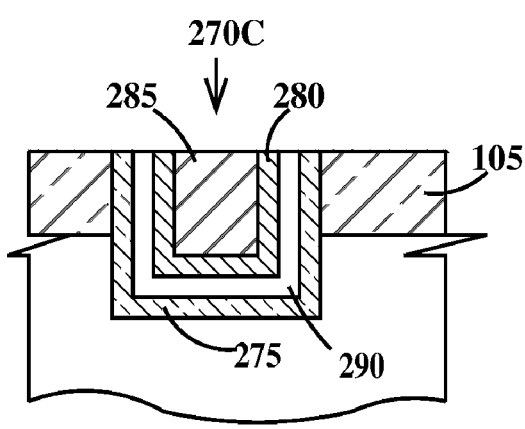
FIG. 4B4

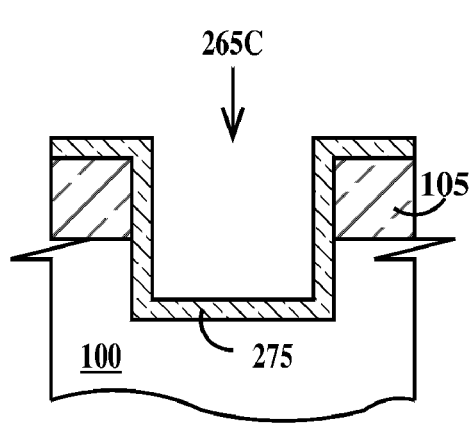
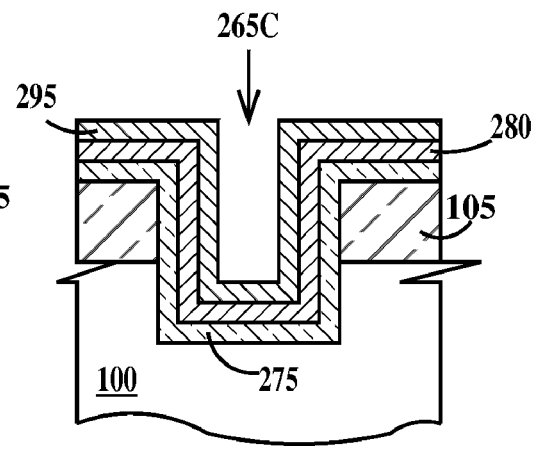
*FIG. 4C1*  *FIG. 4C2*
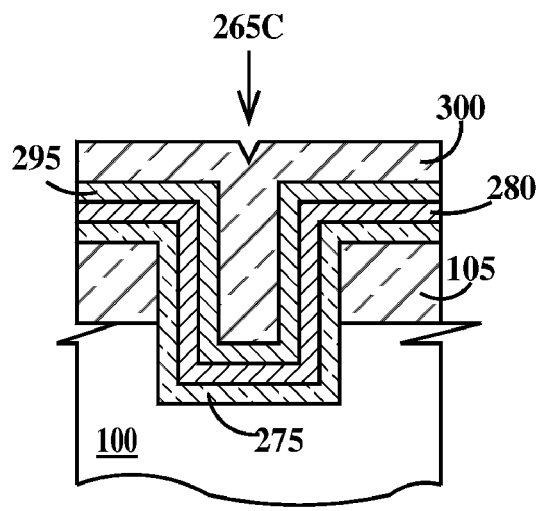
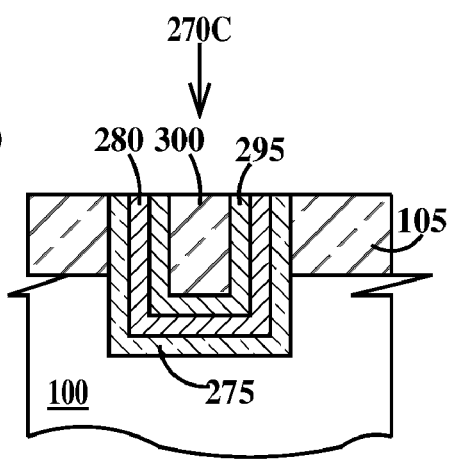
*FIG. 4C3*  *FIG. 4C4*

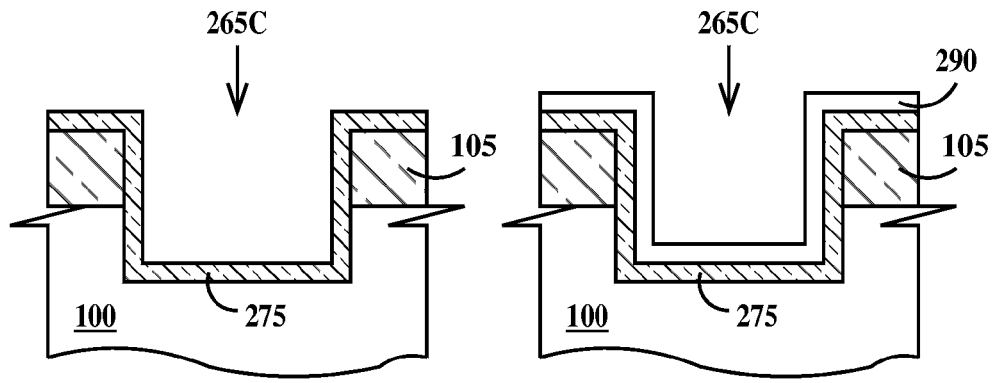
*FIG. 4D1*    *FIG. 4D2*
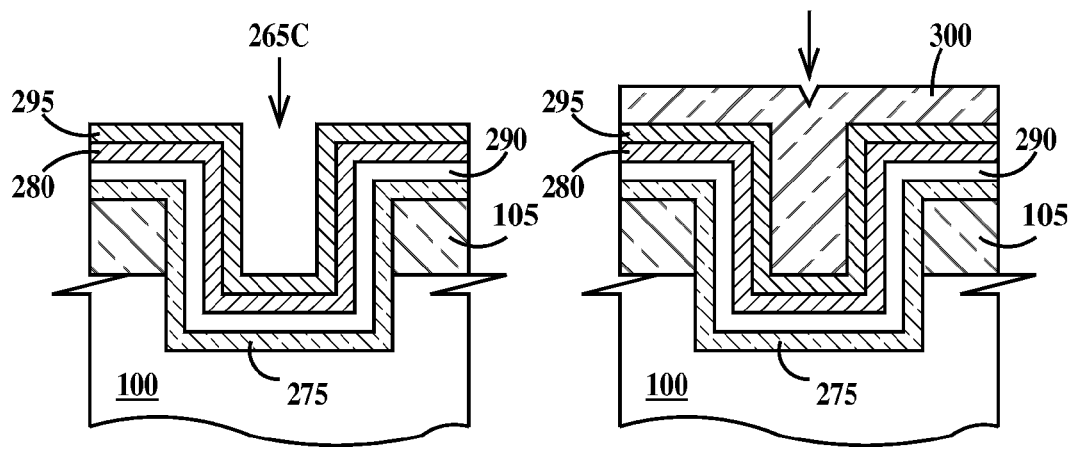
*FIG. 4D3*    *FIG. 4D4*
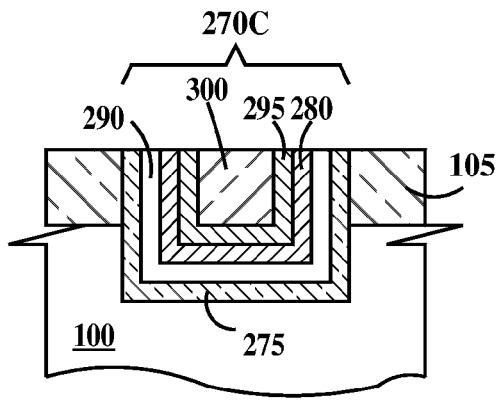
*FIG. 4D5*

LOW RESISTANCE AND INDUCTANCE BACKSIDE THROUGH VIAS AND METHODS OF FABRICATING SAME

This Application is a division of U.S. patent application Ser. No. 11/275,542 filed Jan. 13, 2006 now U.S. Pat. No. 7,563,714 issued Jul. 21, 2009.

FIELD OF THE INVENTION

The present invention relates to the field of integrated circuits; more specifically, it relates to backside through vias and methods of fabricating backside through vias for electrical connection to elements of integrated circuits.

BACKGROUND OF THE INVENTION

There are many integrated circuit applications where it is desirable to reduce the resistance and inductance of signal lines in circuits normally associated with frontside wire bond pad connections. For example, because of the inductance associated with wire bond pad connections to the emitter of NPN hetero-junction bipolar transistors (HBT), the maximum practical operating frequency of circuits using NPN HBTs in wire bond packages is about 3 GHz even though the transistors are capable of running at higher frequencies. Therefore, there is a need for interconnect structures and methods of fabricating interconnect structures with reduced inductance and resistance for connecting signals to circuit elements of integrated circuits.

SUMMARY OF THE INVENTION

A first aspect of the present invention is a method for forming a contact, comprising: forming a dielectric isolation in a substrate, the substrate having a frontside and an opposing backside; forming a first dielectric layer on the frontside of the substrate; forming a trench in the first dielectric layer, the trench aligned over and within a perimeter of the dielectric isolation and extending to the dielectric isolation; extending the trench formed in the first dielectric layer through the dielectric isolation and into the substrate to a depth less than a thickness of the substrate; filling the trench and co-planarizing a top surface of the trench with a top surface of the first dielectric layer to form an electrically conductive through via; and thinning the substrate from the backside of the substrate to expose the through via.

A second aspect of the present invention is the first aspect, further including: forming a device contact opening in the first dielectric layer and simultaneously with the filling the trench and co-planarizing, filling the device contact opening and co-planarizing a top surface of the filled device contact opening with a top surface of the first dielectric layer to form an electrically conductive device contact.

A third aspect of the present invention is the first aspect, further including: before forming the through via, forming a device contact opening in the first dielectric layer, filling the device contact opening and co-planarizing a top surface of the filled device contact opening with a top surface of the first dielectric layer to form an electrically conductive device contact.

A fourth aspect of the present invention is the first aspect, further including: after forming the through via, forming a device contact opening in the first dielectric layer, filling the device contact opening and co-planarizing a top surface of the filled contact opening with a top surface of the first dielectric layer to form an electrically conductive device contact.

A fifth aspect of the present invention is the first aspect, wherein said filling said trench includes: either forming a insulating layer on sidewalls and a bottom of said trench and forming a tungsten layer over said insulating layer, said tungsten layer of sufficient thickness to fill said trench; or forming said tungsten layer on said sidewalls and said bottom of said trench, said tungsten layer of sufficient thickness to fill said trench.

A sixth aspect of the present invention is the first aspect, wherein said filling said trench includes: either forming a insulating layer on sidewalls and a bottom of said trench, forming a conformal polysilicon layer over said insulating layer, and forming a tungsten layer over said polysilicon layer, said tungsten layer of sufficient thickness to fill said trench; or forming said insulating layer on said sidewalls and said bottom of said trench; and forming a tungsten layer over said polysilicon layer, said tungsten layer of sufficient thickness to fill said trench.

A seventh aspect of the present invention is the first aspect, wherein said filling said trench includes: either forming a insulating layer on sidewalls and a bottom of said trench; forming a conformal tungsten layer over said insulating layer, and forming an oxide layer over said tungsten layer, said oxide layer of sufficient thickness to fill said trench; or forming a conformal tungsten layer on said sidewalls and said bottom of said trench, and forming an oxide layer over said tungsten layer, said oxide layer of sufficient thickness to fill said trench.

An eighth aspect of the present invention is the first aspect, wherein said filling said trench includes: either forming a insulating layer on sidewalls and a bottom of said trench, forming a conformal polysilicon layer over said insulating layer, forming a conformal tungsten layer over said polysilicon layer, and forming an oxide layer over said tungsten layer, said oxide layer of sufficient thickness to fill said trench; or forming a conformal polysilicon layer on said sidewalls and said bottom of said trench, forming a conformal tungsten layer over said polysilicon layer, and forming an oxide layer over said tungsten layer, said oxide layer of sufficient thickness to fill said trench.

A ninth aspect of the present invention is the first aspect, further including: forming a hetero-junction bipolar transistor in and on said substrate; forming a device contact in the first dielectric layer, the device contact in physical and electrical contact to an emitter of the hetero-junction bipolar transistor; and forming a wire in a second dielectric layer, the second dielectric layer formed over the first dielectric layer and the wire in direct physical and electrical contact with the device contact and the through via.

A tenth aspect of the present invention is the first aspect, wherein the trench extends to and contacts a buried oxide layer in the substrate and the thinning the substrate removes the buried oxide layer.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIGS. 3A1 through 3A5 are cross-sectional drawings illustrating fabrication of a backside interconnect structure according to a first variation of a third embodiment of the present invention;

FIGS. 3B1 through 3B3 are cross-sectional drawings illustrating fabrication of a backside interconnect structure according to a second variation of the third embodiment of the present invention;

FIGS. 3C1 through 3C3 are cross-sectional drawings illustrating fabrication of a backside interconnect structure according to a third variation of the third embodiment of the present invention;

FIGS. 4A1 through 4A3 are cross-sectional drawings illustrating a first method of filling a through via or stud contact of the third embodiment of the present invention;

FIGS. 4B1 through 4B4 are cross-sectional drawings illustrating a second method of filling a through via or stud contact of the third embodiment of the present invention;

FIGS. 4C1 through 4C4 are cross-sectional drawings illustrating a third method of filling a through via or stud contact of the third embodiment of the present invention;

FIGS. 4D1 through 4D5 are cross-sectional drawings illustrating a fourth method of filling a through via or stud contact of the third embodiment of the present invention;

DETAILED DESCRIPTION OF THE INVENTION

A damascene process is one in which wire trenches or via openings (via openings may also be called via trenches) are formed in a dielectric layer, an electrical conductor of sufficient thickness to fill the trenches is deposited on a top surface of the dielectric, and a planarization process, such as a one or more of a chemical-mechanical-polish (CMP) process or reactive ion etch (RIE) process, is performed to remove excess conductor and male the surface of the conductor co-planer or substantially co-planer with the surface of the dielectric layer to form damascene wires (or damascene vias). When only a trench and a wire (or a via opening and a via) are formed the process is called single-damascene. Stud contacts (which are equivalent to single damascene wires and vias and which are formed in the first dielectric layer over the semiconductor substrate) are also formed using single-damascene processes.

A dual-damascene process is one in which wire and via openings are formed in a dielectric prior to metallization. For example, via openings are formed through the entire thickness of a dielectric layer followed by formation of trenches part of the way through the dielectric layer in any given cross-sectional view. (Alternatively, the wire trenches may be formed first, followed by formation of the via openings.) All via openings intended to conduct electric current are intersected by integral wire trenches above and by a wire trench below, but not all trenches need intersect a via opening. An electrical conductor of sufficient thickness to fill the trenches and via opening is deposited on a top surface of the dielectric and a CMP process is performed to make the surface of the conductor in the trench co-planer with the surface the dielectric layer to form dual-damascene wires and dual-damascene wires having integral dual-damascene vias.

Figure 1A:
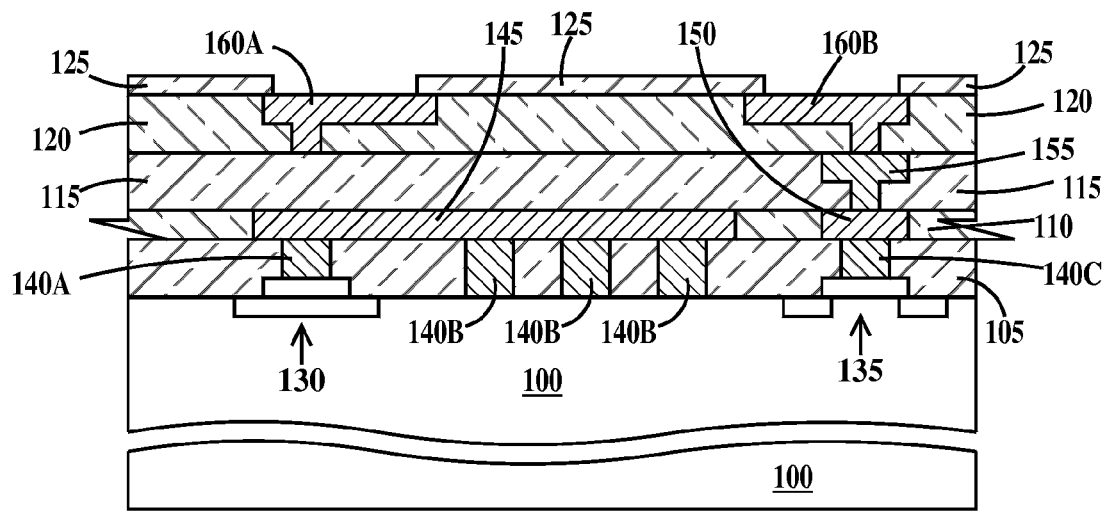
FIGS. 1A through 1E are cross-sectional drawings illustrating fabrication of a backside interconnect structure according to a first embodiment of the present invention.

FIGS. 1A through 1H are cross-sectional drawings illustrating fabrication of a backside interconnect structure according to a first embodiment of the present invention. In FIG. 1A, a portion of an integrated circuit chip before dicing is illustrated. Formed on a substrate 100 is a first dielectric layer 105. Substrate 100 is also commonly called a "wafer." First dielectric layer 105 may be a multilayer dielectric layer comprising, for example, a layer of silicon dioxide ($SiO_2$) contacting substrate 100, a layer of silicon nitride on top of the silicon dioxide layer and a layer of phosphosilicate glass (PSG) or borophosphosilicate glass (BPSG) on top of the $SiO_2$. In a first example, substrate 100 is a bulk silicon substrate. In a second example, substrate 100 is a silicon on insulator (SOI) substrate.

Formed on top of first dielectric layer 105 is a second dielectric layer 110. Formed on top of second dielectric layer 110 is a third dielectric layer 115. Formed on top of third dielectric layer 115 is a fourth dielectric layer 120. In one example, second, third and fourth dielectric layers 110, 115 and 120 each comprising one or more layers of a low K (dielectric constant) material, hydrogen silsesquioxane polymer (HSQ), methyl silsesquioxane polymer (MSQ), SiLK™ (polyphenylene oligomer) manufactured by Dow Chemical, Midland, Tex., Black Diamond™ (methyl doped silica or $SiO_x(CH_3)_y$ or $SiC_xO_yH_y$ or SiOCH) manufactured by Applied Materials, Santa Clara, Calif., organosilicate glass (SiCOH), porous SiCOH, a high, silicon dioxide ($SiO_2$), silicon nitride ($Si_3N_4$), silicon carbide (SiC), silicon oxy nitride (SiON), silicon oxy carbide (SiOC), plasma-enhanced silicon nitride ($PSiN_x$) or NBLok (SiC(N,H)). A low K dielectric material has a relative permittivity of about 3 or less. Formed on top of fourth dielectric layer 120 is a insulating layer 125. In one example, insulating layer 125 comprises a layer of $SiO_2$, $Si_3N_4$, polyimide or combinations of layers thereof. The use of four dielectric layers is exemplary and more or less dielectric layer and corresponding wires and vias may be used.

Formed partially in substrate 100 and partially in first dielectric layer 105 is an exemplary HBT 130. HBT 130, may be replaced by other devices known in the art, such as metal-oxide-silicon field effect transistor (MOSFET)s, standard bipolar transistors, diodes, thin film or diffused silicon substrate resistors and thin film capacitors. (See also FIG. 8A). Formed partially in substrate 100 and partially in first dielectric layer 105 is an exemplary MOSFET 135. MOSFET 135, may be replaced by other devices known in the art, such as standard bipolar transistors, diodes, resistors and capacitors. Formed in first dielectric layer 105 are stud contacts 140A, 140B and 140C. Since stud contacts 140A and 140C contact devices (i.e. HBT 130 and MOSFET 135), stud contacts 140A and 140C may be called device contacts to distinguish them from contacts 140B which will be used to contact a through via as described infra. Formed in second dielectric layer 110 are damascene wires 145 and 150. Damascene wire 145 is in direct physical and electrical contact with stud contacts 140A and 140B and wire 150 is in direct physical and electrical contact with stud contact 140C. Stud contact 140A is in direct physical and electrical contact with HBT 130 (for example the emitter of HBT 130). Stud contacts 140B are in direct physical contact with substrate 100 at this point in the fabrication. Stud contact 140C is in direct physical and electrical contact with MOSFET 135 (for example, the gate of MOSFET 135). In one example, stud contacts 140A, 140B and 140C comprise a core conductor of tungsten (W) surrounded by a liner on the sidewalls and bottom of the core conductor, the liner comprising titanium (Ti), titanium nitride (TiN) or combinations of layers thereof.

Formed in third dielectric layer 115 is a dual-damascene wire/via 155. Formed in fourth dielectric layer is a dual-damascene wirebond pad/vias 160A and 160B. In one example, dual-damascene wire/via 155 and dual-damascene wirebond pad/vias 160A and 160B comprise a core conductor of copper (Cu) surrounded by a liner on the sidewalls and bottom of the core conductor, the liner comprising Ta, TaN, tantalum silicon nitride (TaSiN), tungsten (W), tungsten nitride (WN), titanium nitride (TiN) or combinations of layers thereof. Dual-damascene wirebond pad/vias 160A and 160B may also include a layer of aluminum (Al) on the exposed top surface of the core conductor.

Figure 1B:
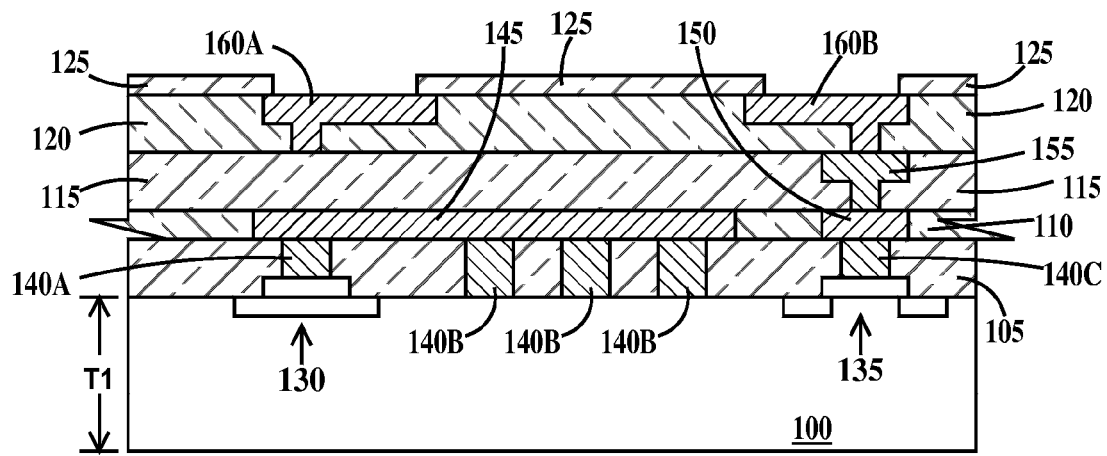

In FIG. 1B, substrate 100 is thinned to a thickness T1. In one example T1 is between about 100 microns and about 400 microns, (in one example about 150 microns). In one example, thinning of substrate 100 may accomplished by backside grinding, wet etching or combinations thereof. Examples of suitable wet etchants include, but are not limited to aqueous tetrametylammonium hydroxide (TMAH), alcoholic potassium hydroxide (KOH) and other aqueous/alcoholic base solutions.

Figure 1C:
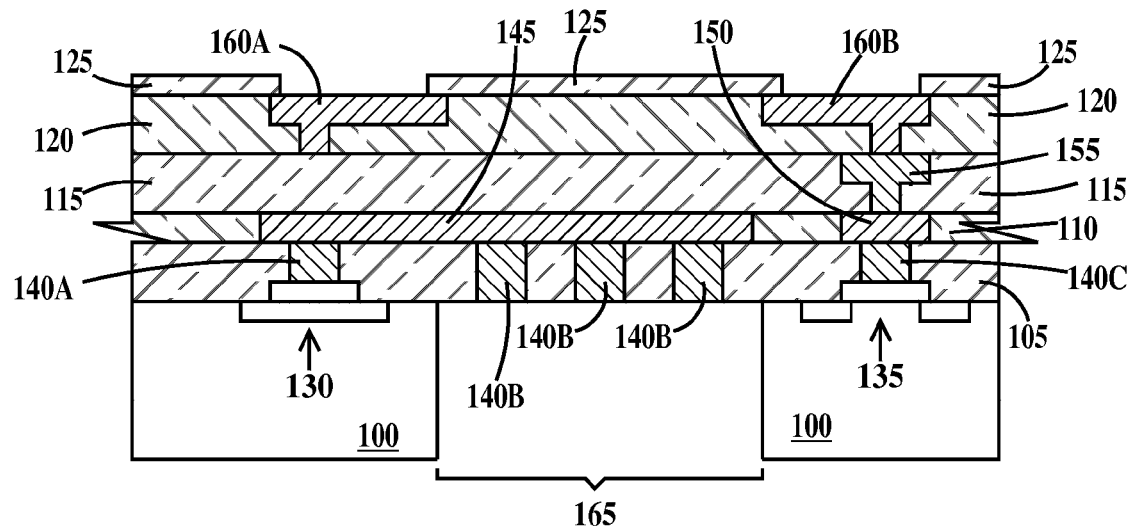

In FIG. 1C, a through via opening 165 is etched from the backside of substrate 100, through the substrate, to expose first dielectric layer 105 and at least bottom surfaces of stud contacts 140B in the bottom of the through via. Through via opening 165 may be formed by applying a photoresist layer on the backside of substrate, exposing the photoresist to actinic radiation and developing the exposed (positive resist) or unexposed (negative resist) and then reactive ion etching (RIE) the substrate. Combinations of RIE and wet etches may be used. Examples of suitable wet etchants include, but are not limited to aqueous tetrametylammonium hydroxide (TMAH), alcoholic potassium hydroxide (KOH) and other aqueous/alcoholic base solutions. In one example the area of backside opening is between about 2,500 square microns and about 10,000 square microns with a depth of at least T1 (see FIG. 1B). In one example, alignment of the photoresist layer to stud contacts 140B utilizes an expose tool equipped with an infrared (IR) alignment system, which allows for alignment to structures, such as studs or wires, on the wafer front side. Although FIG. 1D shows no overetch into dielectric layer 105, some overetch might occur, e.g. 10-500 nm, during the silicon through via etch.

Figure 1D:
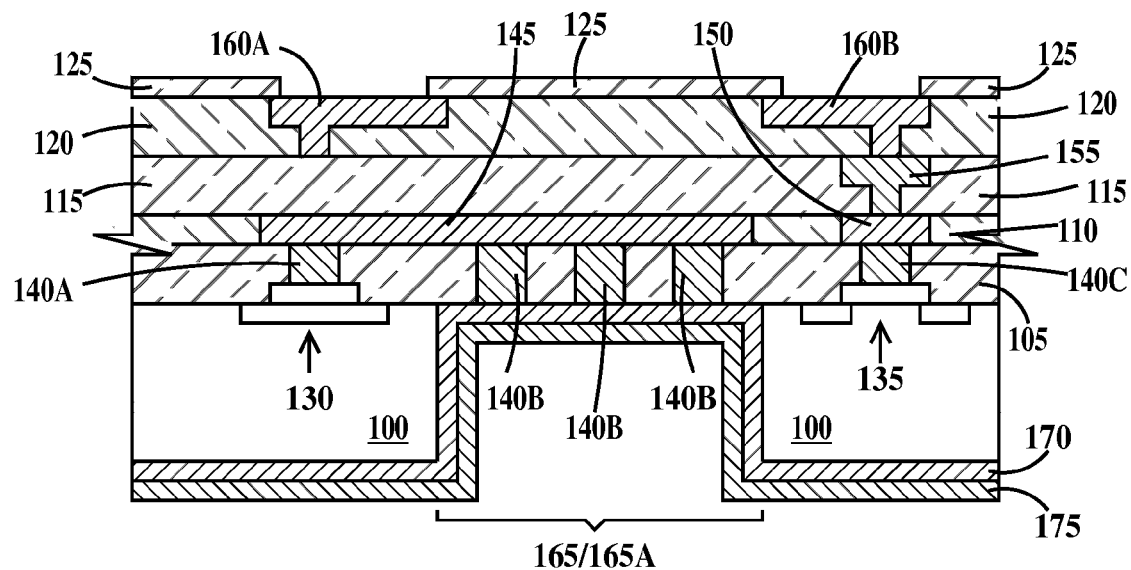

Although FIGS. 1C and 1D do not show how the thinned wafer would be handled as it is processed upside down during the via processing, it is understood that either the substrate frontside would be attached to a temporary or permanent wafer carrier, such as a second quartz or polyimide substrate; or layers 125, 160A, and 160B would be durable enough to withstand the processing shown in FIGS. 1C and 1D. One method of making layers 125, 160A, and 160B durable enough would be to increase the thickness of layer 125 to a few 10's of microns, to raise layers 160A and 160B above the plane of the chuck holding the wafer during the processing shown in FIGS. 1C and 1D; an alternative method would be to limit wafer handling and chucking to the extreme edge of the wafer, (in one example about 2 mm to about 3 mm) from the edge, to prevent mechanical damage of the wafer surface.

In FIG. 1D, a first conformal and electrically conductive layer 170 of refractory material, such as W, Ti, TiN, Ta, TaN or combinations of layers thereof is formed on all exposed surfaces of substrate 100 including sidewalls of through via opening 165 surfaces of first dielectric layer 105 and stud contacts 140B exposed in the bottom of through via opening 165. Then a second conformal and electrically conductive layer 175 is formed in direct physical and electrical contact with exposed surfaces of first conductive layer 170 to form a through via 165A. In one example second conductive layer 175 comprises copper. In one example, first conductive layer 170 is between about 10 nm and about 200 nm thick. In one example, second conductive layer 175 is between about 500 nm and about 10000 nm thick. In one example, the resistance through via 165A is about 0.002 ohm per 10,000 square microns. Thus, a short, low resistance and low inductance path has been created from second conductive layer 175, through first conductive layer 170, stud contacts 140B, damascene wire 145 and stud contact 140A to HBT 130; and all structures wired with through vias are shorted together. In one example, the method terminates at this point so all stud contacts are electrically shorted together. In one example, the methods continues with FIG. 1E.

Figure 1E:
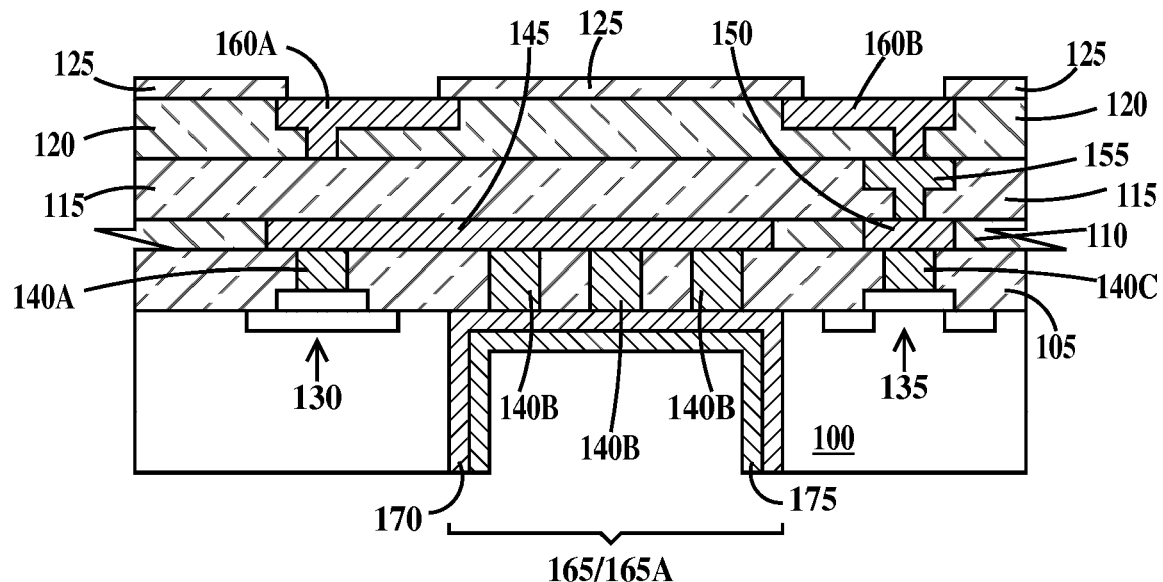

In FIG. 1E, an optional backside chemical-mechanical-polish (CMP) is performed to remove any of first and second conductive layers 170 and 175 from the backside of substrate 100, leaving first and second conductive layers 170 and 175 only within via opening 165.

Figure 1F:
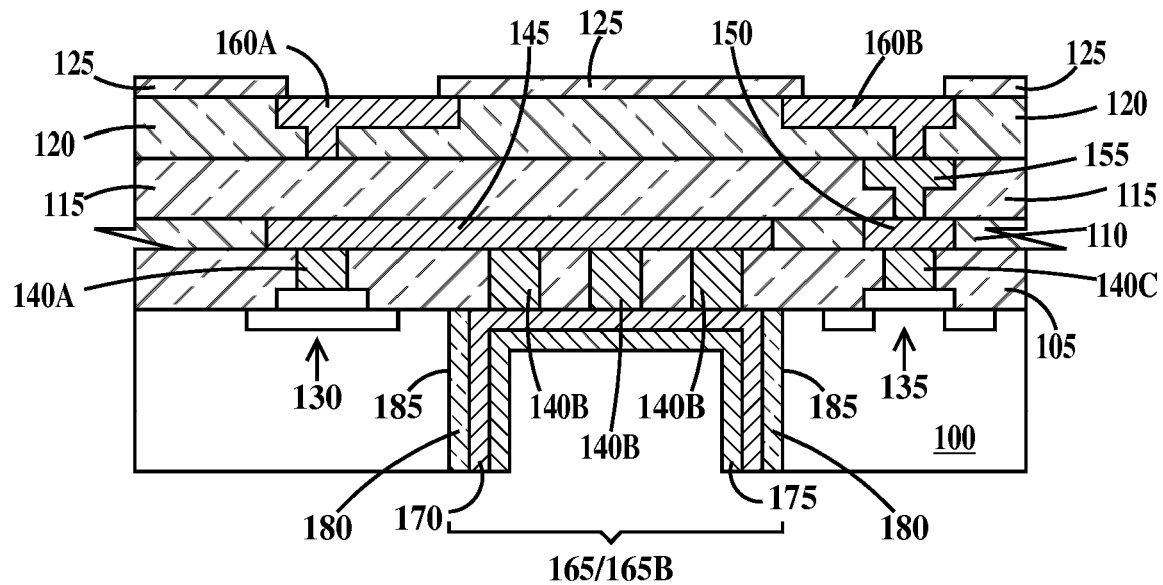
FIGS. 1F through 1H are cross-sectional drawings illustrating variations of backside interconnect structures according to the first embodiment of the present invention.

FIGS. 1F through 1E are cross-sectional drawings illustrating variations of backside interconnect structures according to the first embodiment of the present invention. FIG. 1F is similar to FIG. 1E, except an optional dielectric spacer 180 has been formed on sidewalls 185 of through via 165 so a through via 165B is electrically isolated from substrate 100. (Through via 165A of FIGS. 1D and 1E is shorted to substrate 100). Dielectric spacers 180 may be formed, for example, by deposition of a conformal dielectric material followed by a RIE as is well known in the art. In one example, dielectric spacer 180 is SiO$_2$ and is between about 100 nm and about 2500 nm thick and it is deposited using a chemical vapor deposition (CVD) or atomic layer deposition (ALD) process, such as liquid phase CVD (LPCVD) SiO$_2$, plasma enhanced CVD (PECVD) SiO$_2$, or ALD SiO$_2$.

Figure 1G:
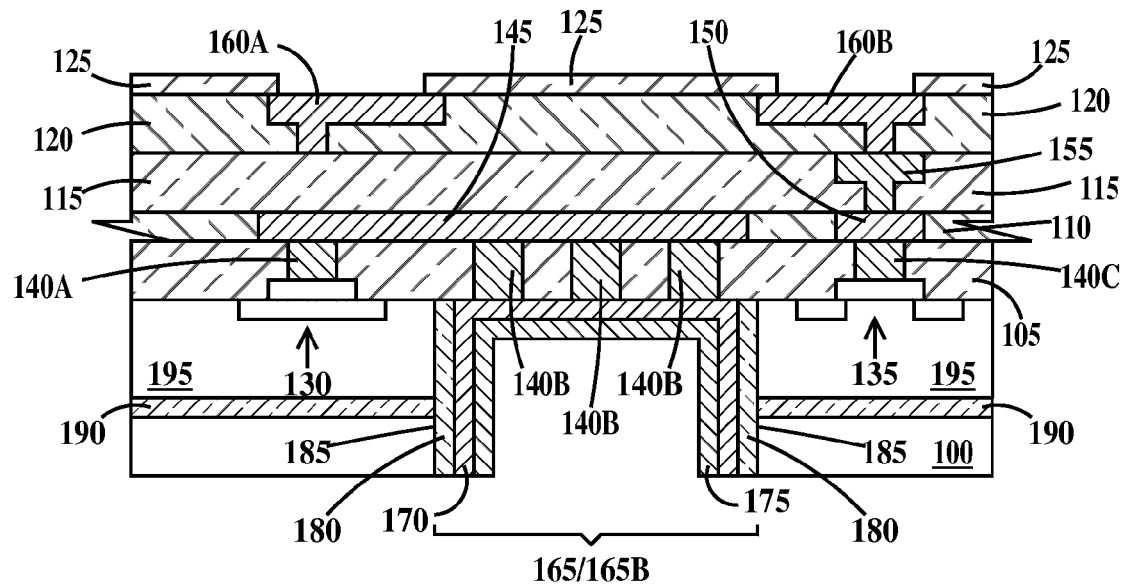

FIG. 1G is similar to FIG. 1F, except substrate 100 is an SOI substrate having a buried oxide layer (BOX) 190 between the bulk of the substrate and a thin silicon layer 195. In one example, silicon layer 195 is about 30 nm thick. Again, dielectric spacers 180 are optional, as is the CMP step used to remove the first and second conductive layers 170 and 175 from the backside surface of substrate 100.

Figure 1H:
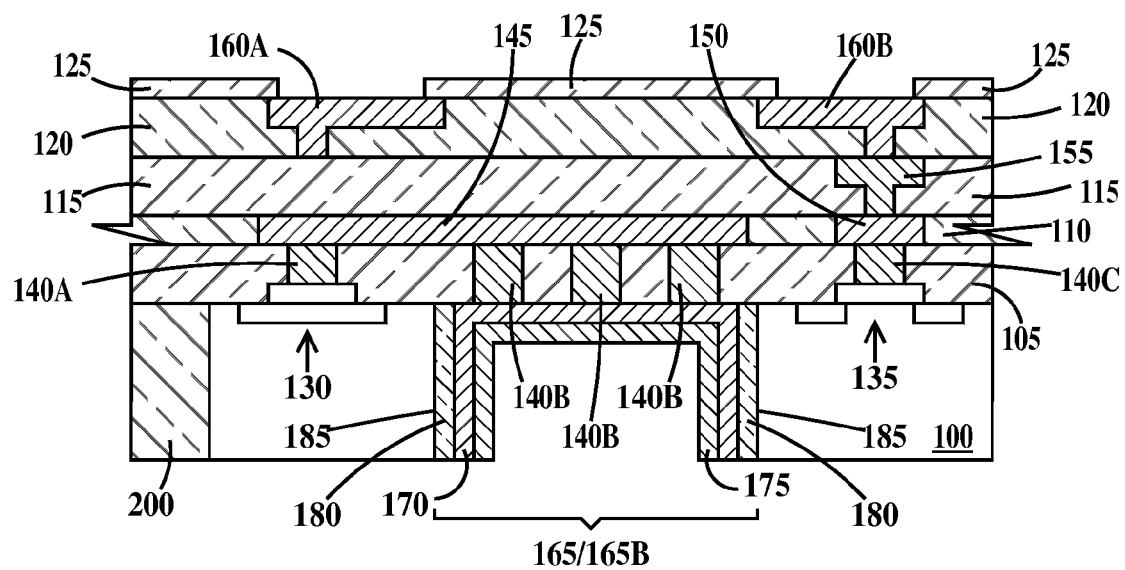

FIG. 1H is similar to FIG. 1F, except substrate 100 includes an embedded alignment mark 200 which is exposed during the processing illustrated in FIG. 1A and described supra. For example, a narrow trench (e.g. 3 um wide) could be lithographically patterned and etched from the substrate front side to a depth equal to or deeper than the thickness of layer 100 in FIG. 1B prior to the deposition of dielectric layer 105 and filled with SiO$_2$. The SiO$_2$ could be deposited using any known method, such as LPCVD, and would be planarized as described supra. Since alignment mark 200 is exposed prior to photoresist application during substrate 100 back side removal, an IR alignment system is not required. In one example alignment mark 200 comprises SiO$_2$. This variation of the first embodiment of the present invention may also use SOI substrates.

Figure 2A:
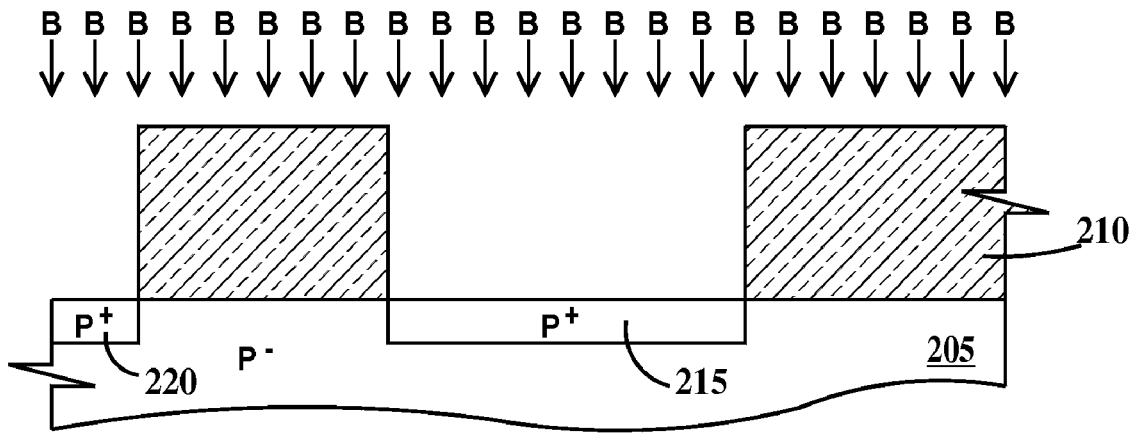
FIGS. 2A through 2E are cross-sectional drawings illustrating fabrication of a backside interconnect structure according to a second embodiment of the present invention.

FIGS. 2A through 2E are cross-sectional drawings illustrating fabrication of a backside interconnect structure according to a second embodiment of the present invention. In FIG. 2A, formed on a lightly doped P-type (P−) substrate 205 is a patterned photoresist layer 210. In one example, substrate 205 is a bulk 100 silicon substrate. A first boron ion implant is performed forming highly P-type doped (P+) regions 215 and 220 in substrate 205. In one example, substrate 205 has a resistivity between about 10 ohm-cm and about 500 ohm-cm. In one example, the first boron ion implant dose is between about 1E15 atoms/cm$^2$ and about 1E16 atoms/cm$^2$ at an energy of between about 3 KeV and about 30 KeV.

Figure 2B:
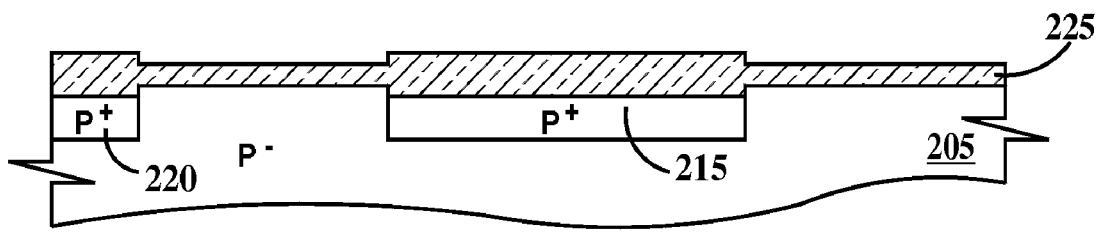

In FIG. 2B, photoresist layer 210 (see FIG. 2A) is removed and an optional anneal is performed to activate and diffuse the dopants (e.g. about 800 to about 1100° C. for about 1 to about 60 minutes) and a wet (or dry) oxidation performed to grow an oxide layer 225 over exposed top surface of substrate 205. Because of the higher doping level of regions 215 and 220, oxide layer 225 is thicker over regions 215 and 220 than over the rest of substrate 205 and are recessed into the surface of substrate 205.

Figure 2C:
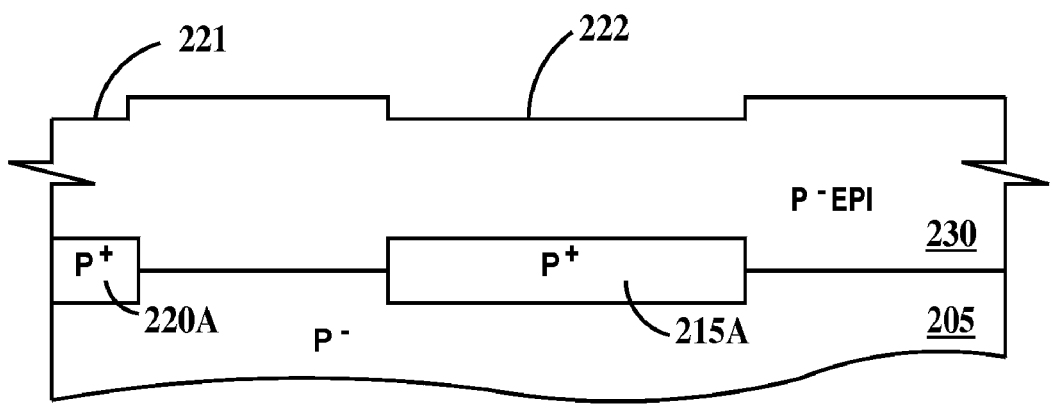

In FIG. 2C, oxide layer 225 is removed (see FIG. 2B) and a doped P-type epitaxial layer 230 is grown. Steps 221 and 222 are defined in epitaxial layer 230 after removal of oxide layer 225 and step 221 can serve as an alignment mark for the processes illustrated in FIG. 2D and described infra. During epitaxial growth, regions 215 and 220 diffuse into substrate 205 and epitaxial layer 230 to form diffused regions 215A and 220A. In one example epitaxial layer 230 is at least about 20 microns thick and has a resistivity between about 10 ohm-cm and about 500 ohm-cm. In one example, epitaxial layer 230 has boron concentration of between about 1E19 atoms/cm$^3$ and about 1E20 atoms/cm$^3$.

Figure 2D:
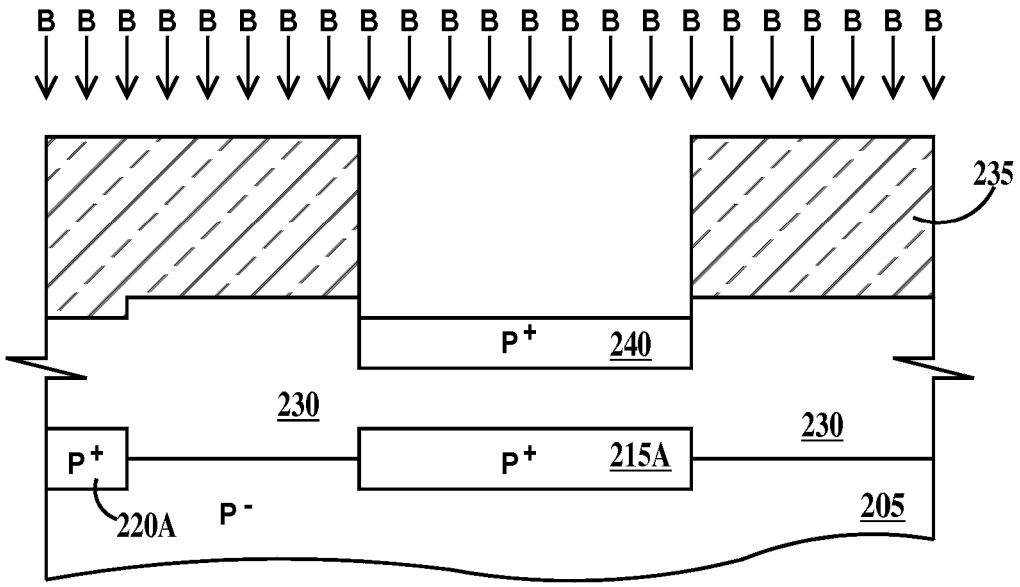

In FIG. 2D, a patterned photoresist layer 235 is formed on epitaxial layer 230. A second boron ion implant is performed using conditions similar to the one described supra in reference to FIG. 2A, forming a highly P-type doped region 240 extending into epitaxial later 230. No ion implant is performed into epitaxial layer 230 over diffused region 220A.

Figure 2E:
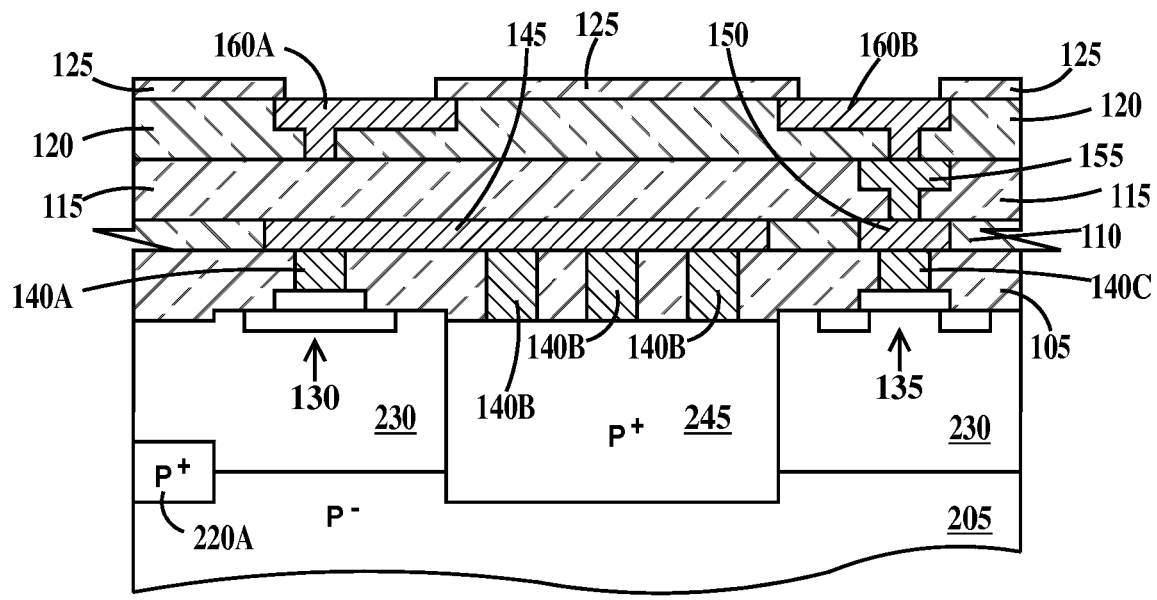

In FIG. 2E, an anneal in an inert atmosphere is first performed which drive implant regions 240 and 215A (see FIG. 2D) together to form a diffused through via 245. In one example, the anneal is performed for about 6 hours at a temperature of about 1200° C. In one example, the boron doping level of through via 245 is between about 1E18 atoms/cm$^3$ and about 5E18 atoms/cm$^3$. In one example, through via 245 has a resistivity between about 0.005 ohm-cm and about 0.05 ohm-cm. In one example, the resistance of through via 245 is about 0.8 ohm per 10,000 square microns. Thus, a short, low resistance and low inductance path has been created from substrate 205, through the through via 245, stud contacts 140B, damascene wire 145 and stud contact 140A to HBT 130. Substrate 205 may be thinned as described supra in reference to the first embodiment of the present invention, however, through vias 245 should not be exposed on the new backside of a thinned substrate 205.

Afterwards, of additional levels of an integrated circuit are performed fabricated and the exemplary HBT, MOSFET 135, stud contacts 140A, 140B and 140C and other structures illustrated in FIG. 2E and described supra are formed. At least one of the photomasks used to fabricate the additional levels may be aligned to step 221 (see FIG. 2C).

FIGS. 3A1 through 3A5 are cross-sectional drawings illustrating fabrication of a backside interconnect structure according to a first variation of a third embodiment of the present invention. In FIG. 3A1, a shallow trench isolation (STI) 250 dielectric is formed between HBT 130 and MOSFET 135. Alternatively, STI 250 may be replaced with a thick field oxide such as a recessed oxidation (ROX) layer. STI 250 extends from the top surface of substrate 100 a fixed depth into the substrate. If substrate 100 is an SOI substrate, then STI 250 may contact the BOX layer which is, for example, about 0.03 microns below the top surface of the substrate. In one example, STI comprises SiO$_2$. Alternatively, any known method in the art to form isolation oxide, such as ROX, could be employed.

In FIG. 3A1, openings 265A and 265B have been formed through first dielectric layer 105 using a photolithographic process. Dielectric layer 105 can be composed of multiple layers, such as one of the group comprising a thin layer of Si$_3$N$_4$, SiC and SiCN in contact with substrate and one of the group comprising a thick layer of SiO2, PSG, BPSG and SiCOH for the balance of the layer.

Opening 265A is aligned over the emitter of HBT 130, openings 265C are aligned over STI 250 and opening 265B over the gate of MOSFET 135. An optional silicide layer (not shown) has been previously formed (prior to formation of dielectric layer 105) on the emitter of HBT 130 the gate of FET 265C exposed in opening 265C. An optional silicide layer (not shown) was also formed over the base and collector of HBT 130, the source and drain of MOSFET 135, contacts to substrate 100, and other structures that requiring ohmic contact. Examples of metal silicides include but is not limited to titanium, cobalt, and nickel silicide. Silicides are usually formed using a self-aligned selective process by deposition of a metal on a silicon surface, heating to between about 400° C. and about 900° C. (in one example, heating to about 600° C.) and etching away the unreacted metal; or other processes, such as polycide with lithographic patterning and RIE or wet etching, can be used.

In FIG. 3A2, openings 265C have been formed through first dielectric layer 105, STI 250 and into substrate 100 using a photolithographic process. Openings 265C have a width W1 and extend depth D1 into substrate 100. In one example, W1 is about 3 microns and D1 is a least about 140 microns. In one example, the total bottom surface area of all openings 265C is about 100 square microns. In one example, openings 265C are etched into substrate 100 using a Bosch RIE process. In a Bosch RIE process, the chemistry is switched between a silicon etch chemistry and a polymer depositing chemistry every few seconds allowing for the formation of high aspect ratio (Depth/Width) openings. Because the openings 265C are relatively small and have very high post etch aspect ratio (about 50:1 as defined as height:width), the silicon etch process should have low undercut of STI 250, substantially vertical sidewalls (e.g. minimal scalloping of the via sidewalls, minimal barreling out of the via sidewalls, and about 90 degree etch angle). To enable the vias to be exposed during subsequent wafer backside removal, the via etch deep needs to have good uniformity. To enable the via to be metallized without excessive wafer bending, the via size needs to be minimized. The data in Table I show acceptable and exemplary values for these parameters.

TABLE I

| Parameter | Acceptable | Exemplary |
|---|---|---|
| Via nominal width | 5 um | 2 um |
| Via average depth | 100 um | 200 um |
| Via depth variation | +/−10% | +/−1% |
| Via etch undercut of dielectric | <0.5 um | <0.05 um |
| Via scalloping minimum to maximum | <0.5 um | <0.05 um |
| Via barreling minimum to maximum | <0.5 um | <0.05 um |
| Via angle | 90 +/− 0.5 | 90 +/− 0.05 |

In FIG. 3A3, upper dielectric layer 107 is removed by a blanket etch and an optional clean performed, for example, a 500:1 BHF flowed by Huang A and B cleans. Then openings 265A, 265B and 265C (see FIG. 3A2) are filled simultaneously using either a fill process illustrated in FIGS. 4A1, through 4A3 or a fill process illustrated in FIGS. 4C1 through 4C4 and described infra to form stud contacts 270A and 270B and through vias 270C. Since stud contacts 270A and 270B contact devices (i.e. HBT 130 and MOSFET 135), stud contacts 270A and 270B may be called device contacts to distinguish them from through vias 270C.

In FIG. 3A3, a blanket etch and an optional clean performed, for example, a 500:1 BHF flowed by Huang A and B cleans. Then openings 265A, 265B and 265C (see FIG. 3A2) are filled simultaneously using either a fill process illustrated in FIGS. 4A1 through 4A3 or a fill process illustrated in FIGS. 4C1 through 4C4 and described infra to form stud contacts 270A and 270B and through vias 270C. Since stud contacts 270A and 270B contact devices (i.e. HBT 130 and MOSFET 135), stud contacts 270A and 270B may be called device contacts to distinguish them from through vias 270C.

In FIG. 3A5, substrate 100 is thinned to a thickness T2. in order to expose through vias 270C. In one example T2 is between about 100 microns and about 150 microns. Thinning may be accomplished by backside grinding, wet etching or combinations thereof. Examples of suitable wet etchants include, but are not limited to aqueous tetrametylammonium hydroxide (TMAH), alcoholic potassium hydroxide (KOH) and other aqueous/alcoholic base solutions.

In one example, the resistance of through vias 270C is about 0.003 ohm per 10,000 square microns. Thus, a short, low resistance and low inductance path has been created from the backside of substrate 100, through the through vias 270C, damascene wire 145 and stud contact 270A to HBT 130.

FIGS. 3B1 through 3B3 are cross-sectional drawings illustrating fabrication of a backside interconnect structure according to a second variation of the third embodiment of the present invention. Except for the fact, that in the second variation of the third embodiment of the present invention, stud contacts are completely formed first and then through vias, the second variation of the third embodiment of the present invention is similar to the first variation.

In FIG. 3B1, openings 265A and 265B are formed in first dielectric layer 105. In FIG. 3B2 openings 265A and 265B (see FIG. 3B1) are filled to form stud contacts 270A and 270B, In one example stud contacts 270A and 270B comprise a core conductor of W surrounded by a liner on the sidewalls and bottom of the core conductor, the liner comprising Ti, TiN or combinations of layers thereof. In FIG. 3B3, through vias 270C are formed by forming openings through first dielectric layer 105, through STI 250, and into substrate 100. Then upper dielectric a blanket etch and an optional clean performed, for example, a 500:1 BHF flowed by Huang A and B cleans. Then the openings are filled using either a fill process illustrated in FIGS. 4A1, through 4A3, a fill process illustrated in FIGS. 4B1 through 4B4, a fill process illustrated in FIGS. 4C1 through 4C4 or a fill process illustrated in FIGS. 4D1 through 4D5 and described infra to form stud contacts 270A and 270B and through vias 270C. The processes illustrated in FIGS. 3A4 and 3A5 and described supra are next performed.

FIGS. 3C1 through 3C3 are cross-sectional drawings illustrating fabrication of a backside interconnect structure according to a third variation of the third embodiment of the present invention. Except for the fact that in the third variation of the third embodiment of the present invention stud contacts are not formed until after the through vias, the third variation of the third embodiment of the present invention is similar to the first variation.

In FIG. 3C1, through vias 270C are formed by etching openings through dielectric layer 105, through STI 250 and into substrate 100 as described supra in reference to the first variation of the third embodiment of the present invention. Then the openings are filled using either a fill process illustrated in FIGS. 4A1, through 4A3, a fill process illustrated in FIGS. 4B1 through 4B4, a fill process illustrated in FIGS. 4C1 through 4C4 or a fill process illustrated in FIGS. 4D1 through 4D5 and described infra to form through vias 270C. In FIG. 3C2, openings 265A and 265C are formed in first dielectric layer 105. In FIG. 3C3, a blanket etch and an optional clean performed, for example, a 500:1 BHF flowed by Huang A and B cleans. Then openings 265A and 265C (see FIG. 3C2) are filled to form stud contacts 270A and 270B. In one example stud contacts 270A and 270B comprise a core conductor of W surrounded by a liner on the sidewalls and bottom of the core conductor, the liner comprising Ti, TiN or combinations of layers thereof. The processes illustrated in FIGS. 3A4 and 3A5 and described supra are next performed.

Again, substrate 100 may be an SOI substrate for any of the three variations of the third embodiment of the present invention.

In the following four methods of filling a through via/and or a stud contact depending upon the variation of the third embodiment of the present invention that is being practiced, only an exemplary through via will be illustrated.

FIGS. 4A1 through 4A3 are cross-sectional drawings illustrating a first method of filling a through via or stud contact of the third embodiment of the present invention. In FIG. 4A1, opening 265C is cleaned using, for example, buffered hydrofluoric acid (BHF) and Huang A and B wet cleans. Then an optional conformal insulating layer 275 is formed on the sidewalls and bottom of openings 265C. Insulating layer 275 may be formed by thermally oxidizing the exposed silicon surface or by depositing a dielectric film using LPCVD or deposited using an ALD SiO2 process. An important property of optional insulating layer 275 is that it have close to 100% conformality (e.g. it covers the via sidewalls and bottoms with enough film to electrically insulate the via from the substrate). Insulating layer 275 is used only when is desirable to electrically isolate the through via from substrate 100. Then a conformal conductive liner 280 comprising one or more layers of TiN formed by chemical vapor deposition (CVD), separated by hydrogen plasma densification steps as known in the art, is formed over insulating layer 275, if present or on sidewalls and bottom of opening 265C if there is no insulating layer.

In FIG. 4A2, a metal organic CVD (MOCVD) W deposition from tungsten hexa-fluoride ($WF_6$) is performed to form a tungsten layer 285 over liner 280 and to fill opening 265B. Tungsten layer 285 overfills opening 265C. Tungsten layer 285 needs to have good sidewall coverage and minimal bread loafing (the notch in the top of tungsten layer 285) during the portion of the deposition when the through via is being filled and low stress during the overburden portion of the deposition. Optimal W sidewall coverage is achieved by depositing the film at relatively low temperature (e.g. about 350° C. to about −400° C.) and in a $WF_6$ saturated (e.g. high $WF_6$ flow) regime, which results in a high tensile stress. To reduce stress and wafer (substrate) bending, it is advantageous to perform the overburden portion of the W deposition using a minimal $WF_6$ flow, in a $WF_6$ starved regime, or performing the deposition at a maximum possible temperature (e.g. about 418° C. to about 450° C.) or both. In order to reduce attack of silicon by $WF_6$ it is advantageous to mix silane ($SiH_4$) or diborane ($B_2H_6$) with the $WF_6$ as known in the art (e.g. silane or diborane CVD W nucleation).

In FIG. 4A3 a CMP is performed, coplanizing the top surfaces of first dielectric layer 105 and through vias 270C.

Alternatively, excess W may be removed by a wet etch using, for example, aqueous hydrogen peroxide ($H_2O_2$) followed by a CMP.

FIGS. 4B1 through 4B4 are cross-sectional drawings illustrating a second method of filling a through via or stud contact of the third embodiment of the present invention. In FIG. 4B1, opening 265C is cleaned using, for example, buffered hydrofluoric acid (BHF) and Huang A and B wet cleans. Then optional insulating layer 275 is formed on the sidewalls and bottom of openings 265C, as discussed supra.

In FIG. 4B2, a conformal polysilicon layer 290 is formed over insulating layer 275, if present or on sidewalls and bottom of opening 265C if there is no insulating layer. If silicide is present under the stud contacts, then the LPCVD polysilicon temperature should be held to no higher than about 620° C. for CoSi and about 800° C. for TiSi in order to avoid degradation of the silicide.

In FIG. 4B3, liner 280 comprising TiN (described supra) is formed over polysilicon layer 290 and tungsten layer 285 formed over liner 280 to overfill opening 265C. In order to reduce stress and wafer (substrate) bending, it is advantageous to perform the W overburden deposition using a minimal $WF_6$ flow or performing the deposition at a maximum possible temperature or both, as described supra.

In FIG. 4B4 a CMP is performed, coplanizing the top surfaces of first dielectric layer 105 and through vias 270C.

FIGS. 4C1 through 4C4 are cross-sectional drawings illustrating a third method of filling a through via or stud contact of the third embodiment of the present invention. In FIG. 4C1, opening 265C is cleaned using, for example, buffered hydrofluoric acid (BHF) and Huang A and B wet cleans. Then optional insulating layer 275 is formed on the sidewalls and bottom of opening 265C, as discussed supra.

In FIG. 4C2, liner 280 comprising TiN (described supra) is formed over insulating layer 275, if present or on sidewalls and bottom of opening 265C if there is no insulating layer. Then a conformal tungsten layer 295 is formed over liner 280.

In FIG. 4C3, a dielectric layer 300, such as $SiO_2$, is formed which overfills openings 265C with a tungsten layer 295. In one example, dielectric layer 300 is tetraethoxysilane oxide (TEOS) deposited at 400° C. using PECVD.

In FIG. 4C4, a CMP is performed, coplanizing the top surfaces of first dielectric layer 105 and through vias 270C.

FIGS. 4D1 through 4D5 are cross-sectional drawings illustrating a fourth method of filling a through via or stud contact of the third embodiment of the present invention. In FIG. 4D1, opening 265C is cleaned using, for example, buffered hydrofluoric acid (BHF) and Huang A and B wet cleans. Then optional insulating layer 275 is formed on the sidewalls and bottom of openings 265C, as discussed supra.

In FIG. 4D2, conformal polysilicon layer 290 is formed over insulating layer 275, if present or on sidewalls and bottom of opening 265C if there is no insulating layer. If silicide is present under the stud contacts, then the LPCVD polysilicon temperature should be held to no higher than about 620° C. for CoSi and about 800° C. for TiSi in order to avoid degradation of the silicide.

In FIG. 4D3, liner 280 comprising TiN (described supra) is formed over polysilicon layer 290 and a conformal tungsten layer 295 is formed over liner 280. In order to reduce stress and wafer (substrate) bending, it is advantageous to perform the W deposition using a minimal $WF_6$ flow or performing the deposition at a maximum possible temperature (see supra) or both. In order to reduce attack of silicon by $WF_6$ it is advantageous to mix diborane ($B_2H_6$) with the $WF_6$ as known in the art. In FIG. 4D4, oxide layer 300 (as described supra) is deposited over tungsten layer 295 which overfills opening 265C. In one example, oxide layer 300 is TEOS.

In FIG. 4D5 a CMP is performed, coplanizing the top surfaces of first dielectric layer 105 and through vias 270C.

The first (FIGS. 4A1 through 4A3) and third (FIGS. 4C1 through 4C4) fill processes described supra may be used with the first (FIGS. 3A1-3A5) variation of the third embodiment of the present invention. The first (FIGS. 4A1 through 4A3), second (FIGS. 4B1 through 4B4), third (FIGS. 4C1 through 4C4) and fourth (FIGS. 4D1 through 4D5) fill processes described supra may be used with the second (FIGS. 3B1 through 3B3) and third variations (FIGS. 3B1 through 3B3) of the third embodiment of the present invention.

Figure 5A:
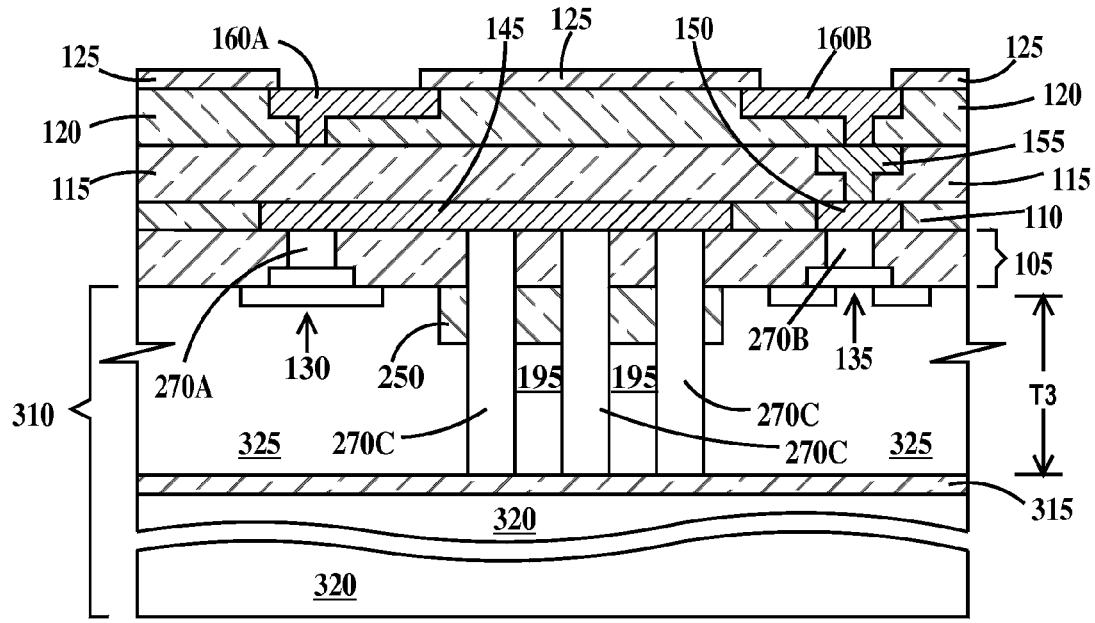
FIGS. 5A and 5B are cross-sectional drawings illustrating fabrication of a backside interconnect structure using alternative substrate according to any of the variations of the third embodiment of the present invention.
Figure 5B:
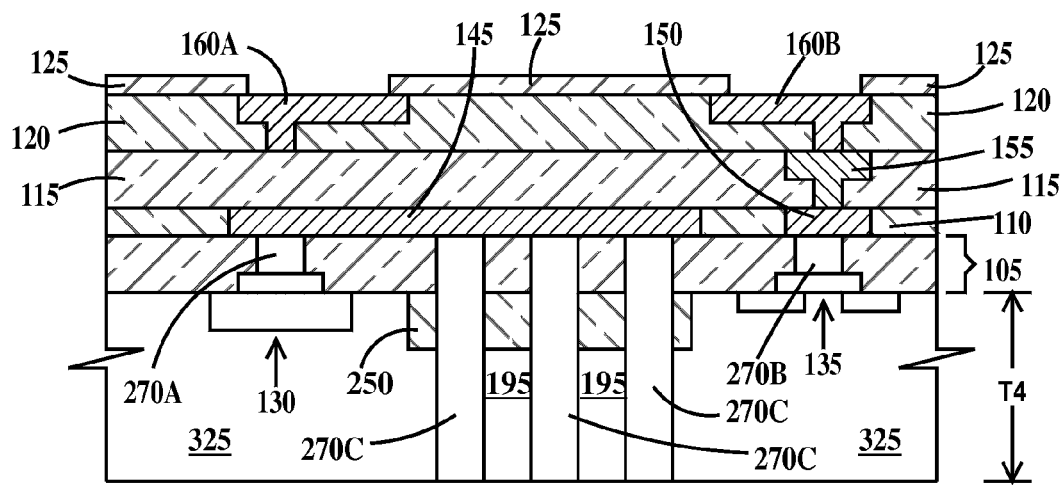

FIGS. 5A and 5B are cross-sectional drawings illustrating fabrication of a backside interconnect structure using alternative substrate according to any of the variations of the third embodiments of the present invention. All three variations of the third embodiment of the present invention can use the alternate substrate described infra. FIGS. 5A and 5B would replace FIGS. 3A4 and 3A5 respectively.

FIG. 5A is similar to FIG. 3A4 except substrate 100 is replaced with a substrate 310 having a buried oxide layer (BOX) 315 between a lower portion 320 and upper portion 325. Upper portion 325 may be mono-crystalline silicon or standard SOI. Lower portion 320 may also be mono-crystalline silicon. In one example, substrate 310 is a bulk silicon substrate in which BOX 315 is formed. In a second example, substrate 310 is a bonded substrate and lower portion 320 and silicon layer 325 are bonded together via buried oxide layer 315. Silicon layer 325 has a thickness T3. In one example T3 is between about 140 micron and about 160 microns and buried oxide layer 315 is between about 0.2 microns and about 5 microns thick. Silicon layer 325 may be an SOI layer, e.g. contain an additional BOX layer about 300 nm below the top surface of silicon layer 325. BOX layer 315 acts as a silicon etch stop as openings 265C (see for example, FIG. 3A2) are etched so all openings 265C are of uniform depth and relatively uniform width. Through vias 270C are metallized as discussed supra, prior to forming the first wire level 110.

In FIG. 5B, substrate 310 is thinned to a thickness T4, removing all of BOX layer 315 (see FIG. 5A) in order to expose through vias 270C. In one example T4 is between about 100 microns and about 150 microns. Thinning may be accomplished by backside grinding, wet etching or combinations thereof. Examples of suitable wet etchants include, but are not limited to aqueous tetramethylammonium hydroxide (TMAH), alcoholic potassium hydroxide (KOH) and other aqueous/alcoholic base solutions.

Figure 6A:
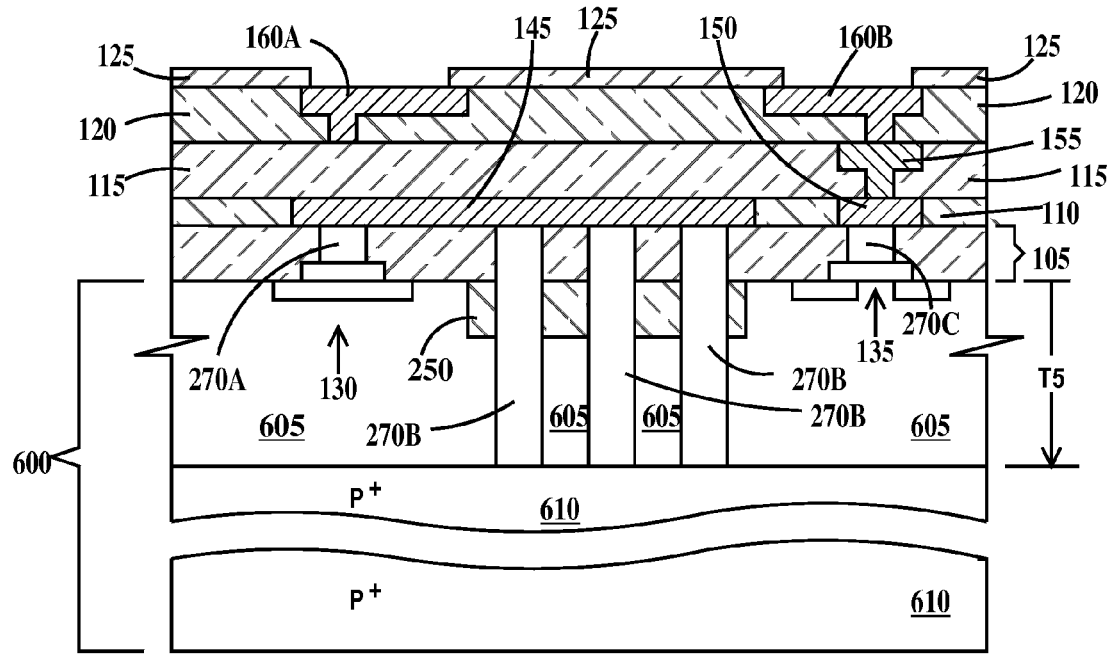
FIGS. 6A and 6B are cross-sectional drawings illustrating fabrication of a backside interconnect structure according to a fourth embodiment of the present invention.
Figure 6B:
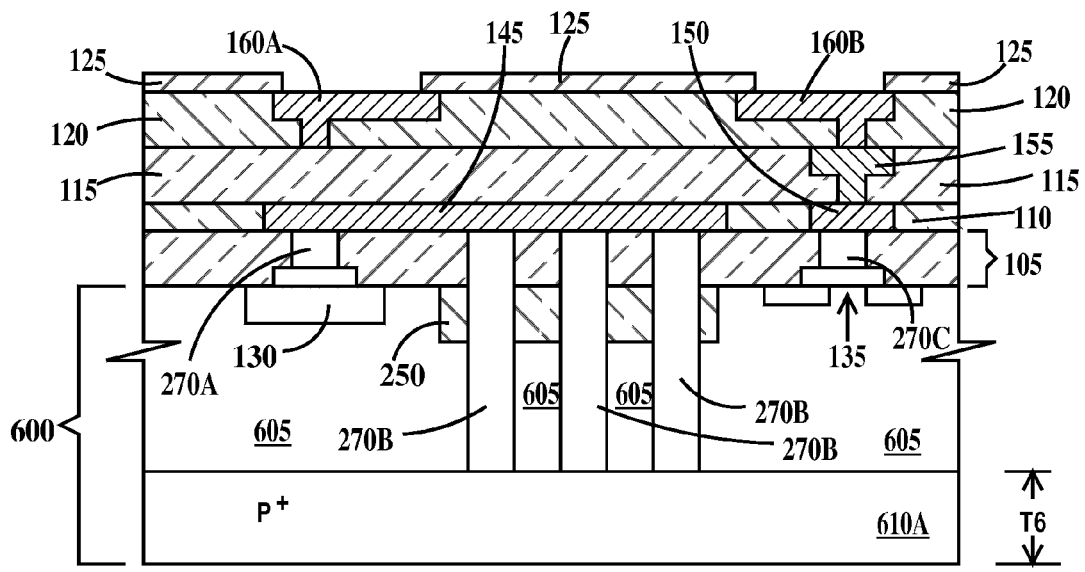

FIGS. 6A and 6B are cross-sectional drawings illustrating fabrication of a backside interconnect structure according to a fourth embodiment of the present invention. The fourth embodiment of the present invention is similar to the third embodiments except for the use of a different substrate and the fact that the through vias 270C (see FIG. 6B) are not exposed on the backside of the substrate. All three variations of the third embodiment of the present invention to form stud contacts and through vias as well as any of the four fill methods may be practiced in conjunction with the fourth embodiment of the present invention. FIGS. 6A and 6B would replace FIGS. 3A4 and 3A5 respectively.

FIG. 6A is similar to FIG. 3A4 except substrate 100 is replaced with a substrate 600 comprising a upper substrate 605 having a thickness T5. Upper substrate 605 is either bonded to lower substrate 610, or is formed using the process illustrated in FIGS. 2B and 2C and supra. Upper substrate is lightly P-type doped relative to more highly P-type doped lower substrate 610. In a first example, both upper and lower substrates 605 and 610 are bulk silicon substrates. In a second example, upper substrate 605 is an SOI substrate and lower substrate 610 is a bulk silicon substrate. Upper 605 may be formed from a thinned SOI substrate or a BOX layer may be formed in the upper substrate after bonding. Through vias physically and electrically contact lower substrate 610 and may be slightly embedded into lower substrate 610. In one example lower 610 has a resistivity between about 0.005 ohm-cm and about 0.05 ohm cm. In one example upper substrate 605 has a resistivity between about 10 ohm-cm and about 500 ohm cm. In one example T5 is between about 40 microns and about 100 microns.

In FIG. 6B, lower substrate 610 (see FIG. 6A) is thinned by backside grinding, wet etching or combinations thereof, to form thinned lower substrate 610A having a thickness T6. In one example T6 is between about 50 microns and about 100 microns. In one example the combined resistance of thinned lower substrate 610A and through vias 270C is less than about 0.4 ohms per 10,000 square microns.

Figure 7:
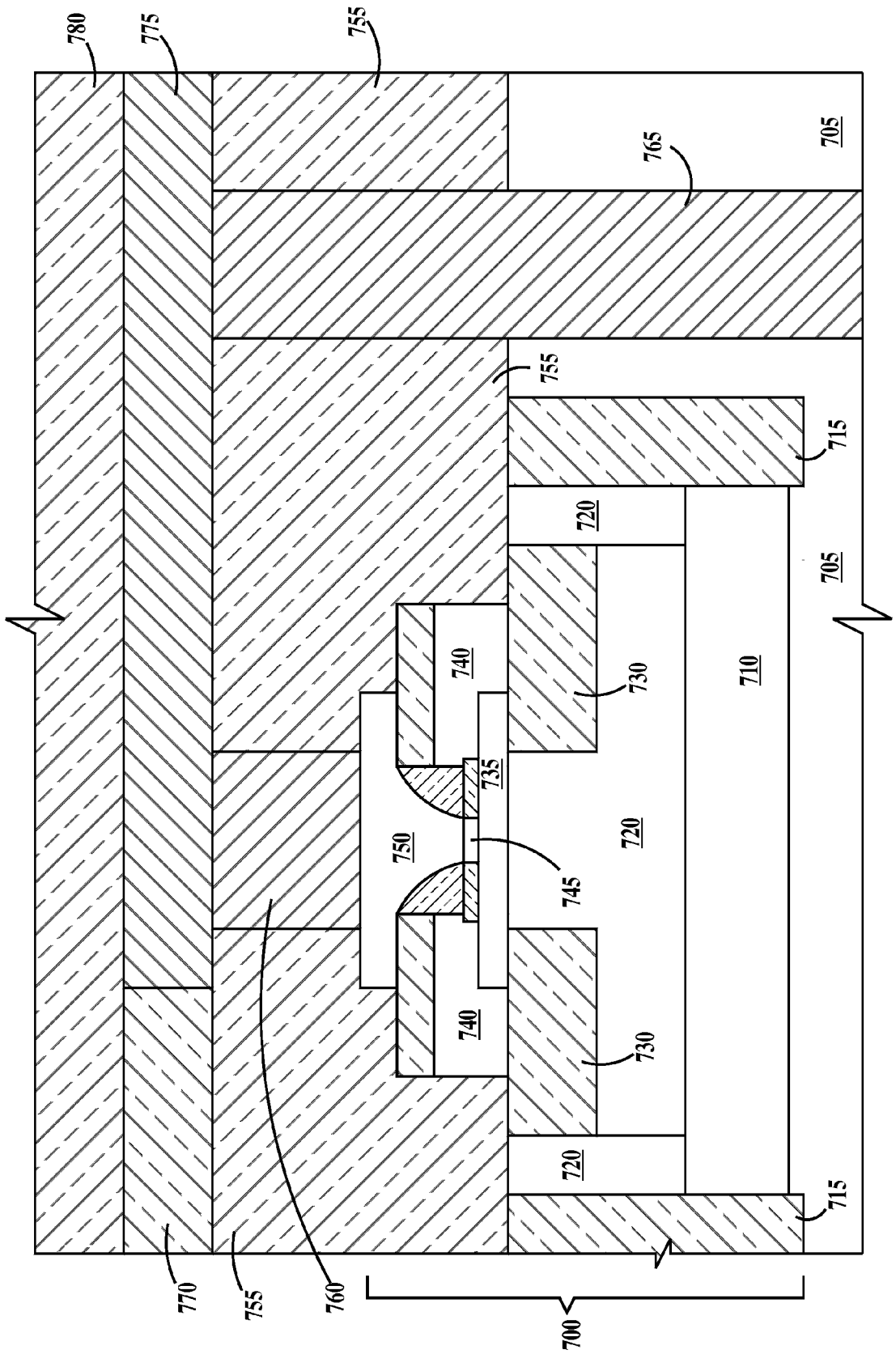
FIG. 7 is a cross-sectional view of an exemplary heterojunction bipolar transistor having a backside connection to a substrate.

FIG. 7 is a cross-sectional view of an exemplary heterojunction bipolar transistor having a backside connection to a substrate. In FIG. 7, a HBT 700 includes, formed in a substrate 705, a subcollector 710 formed in an N-well 715 surrounded by deep trench isolation 720 and contacted by reach throughs 725, and STI 730. HBT 700 also includes, formed on top of substrate 705, a P type low-temperature epitaxial (LTE) base 735, a P type polysilicon base 740, an N type mono-crystalline emitter 745 and a polysilicon emitter 750. LTE base 735 may comprise SiGe or SiGeC. SiGe (and SiGeC) bipolar transistors are examples of hetero-junction bipolar transistors. Mono-crystalline emitter 745 is formed from a portion of polysilicon emitter 750 that is in direct physical contact with LTE base 735. Likewise LTE base 735 is formed from that portion of polysilicon base 740 in direct physical contact with N-well 720.

Formed in a first dielectric layer 755 is a stud contact 760 in physical and electrical contact with polysilicon emitter 750. There may be a layer of metal silicide between stud contact 760 and polysilicon emitter 750. Also formed in first dielectric layer 755 is a though via 765 extending into/through substrate 705 according to any of the various embodiments of the present invention. Formed in a second dielectric layer 770 is a damascene wire 775. Damascene wire 770 is in direct physical and electrical contact with stud contact 755 and through via 765, thus providing an electrical path from the emitter of HBT 700 to the backside of substrate 705. The connection to the emitter of HBT 700 should be considered exemplary and connections may be made to the base or collector reach throughs. A third dielectric layer 780 is formed on top of second dielectric layer 770 and wire 775. Additional dielectric layers and wiring layers may be formed as required.

Thus, the various embodiments of the present invention provide interconnect structures and methods of fabricating interconnect structures with reduced inductance and resistance for connecting signals to circuit elements of integrated circuits.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A structure, comprising:
a substrate having a frontside and an opposing backside;
dielectric isolation formed in said substrate and extending from said top surface of said substrate into said substrate, a top surface of said dielectric isolation coplanar with said frontside of said substrate;
a bottom surface of a first dielectric layer on said frontside of said substrate and on said top surface of said dielectric isolation; and
an electrically conductive through via extending from a top surface of said dielectric layer through said dielectric isolation to said bottom surface of said substrate.

2. The structure of claim 1, wherein, a top surface of said through via is coplanar with said top surface of said dielectric layer and a bottom surface of said through via is coplanar with said backside of said substrate.

3. The structure of claim 1, further including:
a device contact extending through said first dielectric layer and electrically contacting a device formed in said substrate, in said first dielectric layer or both in said substrate and in said first dielectric layer.

4. The structure of claim 3, wherein said device contact and said through via both comprise layers of same materials, said layers of same materials layered upon each other in a same sequence.

5. The structure of claim 3, wherein said through via includes an insulating layer on sidewalls of said through via, said insulating layer comprising silicon dioxide.

6. The structure of claim 1, wherein said through via comprises either:
a tungsten core and a titanium nitride liner on sidewalls and a bottom of said tungsten core; or
said tungsten core, a titanium nitride liner on said sidewalls and said bottom of said tungsten core and an insulating layer on said titanium nitride liner.

7. The structure of claim 1, wherein said through via comprises either:
a tungsten core, a titanium nitride liner on sidewalls and a bottom of said tungsten core, and a polysilicon layer on said titanium nitride liner; or
a tungsten core, a titanium nitride liner on sidewalls and a bottom of said tungsten core, a polysilicon layer on said titanium nitride liner and an insulating layer on sidewalls of said polysilicon layer.

8. The structure of claim 1, wherein said through via comprises either:
an oxide core, a tungsten liner on sidewalls and a bottom of said oxide core, a titanium nitride liner on said tungsten liner; or
an oxide core, a tungsten liner on sidewalls and a bottom of said oxide core, a titanium nitride liner on said tungsten liner and an insulating sidewalls of said titanium nitride liner.

9. The structure of claim 1, wherein said through via comprises either:
an oxide core, a tungsten layer on sidewalls and a bottom of said oxide core, a titanium nitride liner on said tungsten layer, and a polysilicon layer on said titanium nitride liner; or
an oxide core, a tungsten layer on said sidewalls and said bottom of said oxide core, a titanium nitride liner on said tungsten layer, a polysilicon layer on said titanium nitride liner, and an insulating layer on sidewalls of said polysilicon layer.

10. The structure of claim 1, further including:
a hetero-junction bipolar transistor formed on and in said substrate;
a device contact in said dielectric layer, said device contact in physical and electrical contact to an emitter of said hetero-junction bipolar transistor; and
a wire in an additional dielectric layer, said additional dielectric layer formed over said dielectric layer, and said wire in direct physical and electrical contact with said device contact and said through via.

11. A structure, comprising:
a dielectric layer on a frontside of a substrate;
an electrically conductive stud contact in said dielectric layer, said stud contact extending from a top surface of said dielectric layer through said first dielectric layer to said frontside of said substrate;
a trench in said substrate, said trench extending from a backside of said substrate to said first dielectric layer, a bottom surface of said stud contact exposed in said trench; and
a conformal electrically conductive layer over sidewalls of said trench, on exposed surfaces of said first dielectric layer and on exposed surfaces of said stud contact, said conductive layer not thick enough to completely fill said trench.

12. The structure of claim 11, further including, wherein said conductive layer extends over said backside of said substrate.

13. The structure of claim 11, further including:
a conformal dielectric layer on said sidewalls of said trench and between said substrate exposed in said trench and said conductive layer.

14. The structure of claim 11, wherein said conformal electrically conductive layer comprises a first layer comprising copper over a second layer comprising a layer of W, a layer of Ti, a layer TiN, a layer of Ta, a layer of TaN or combinations thereof.

15. The structure of claim 11, further including:
a hetero-junction bipolar transistor formed on and in said substrate;
an additional stud contact in said dielectric layer, said additional stud contact in physical and electrical contact with an emitter of said hetero-junction bipolar transistor; and
a wire in an additional dielectric layer, said additional dielectric layer over said dielectric layer, said wire in direct physical and electrical contact with said stud contact and said additional stud contact.

* * * * *